United States Patent
Howald et al.

(10) Patent No.: US 10,256,078 B2
(45) Date of Patent: Apr. 9, 2019

(54) SYSTEMS AND METHODS FOR INCREASING EFFICIENCY OF DELIVERED POWER OF A MEGAHERTZ RADIO FREQUENCY GENERATOR IN THE PRESENCE OF A KILOHERTZ RADIO FREQUENCY GENERATOR

(71) Applicant: Lam Research Corporation, Fremont, CA (US)

(72) Inventors: Arthur M. Howald, Livermore, CA (US); John C. Valcore, Jr., Fremont, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/986,688

(22) Filed: May 22, 2018

(65) Prior Publication Data

US 2019/0027342 A1    Jan. 24, 2019

Related U.S. Application Data

(63) Continuation of application No. 15/655,808, filed on Jul. 20, 2017, now Pat. No. 10,020,168.

(51) Int. Cl.
*H01J 37/32* (2006.01)

(52) U.S. Cl.
CPC .... *H01J 37/32155* (2013.01); *H01J 37/3299* (2013.01); *H01J 37/32183* (2013.01); *H01J 2237/332* (2013.01); *H01J 2237/334* (2013.01)

(58) Field of Classification Search
CPC ........ H01J 7/24; H01J 37/32; H01J 37/32155; H01J 37/32183; H01J 37/32082;
(Continued)

(56) References Cited

U.S. PATENT DOCUMENTS

| 7,940,008 B2 * | 5/2011 | Mattaboni | G01N 21/73 315/111.21 |
| 2013/0119017 A1 * | 5/2013 | Yang | H01J 37/32082 216/61 |

(Continued)

OTHER PUBLICATIONS

ISR and Written Opinion, PCT/US2018/036512, dated Sep. 28, 2018, 24 pages.

*Primary Examiner* — Jimmy Vu
(74) *Attorney, Agent, or Firm* — Penilla IP, APC

(57) ABSTRACT

Systems and methods for tuning a radio frequency (RF) generator are described. One of the methods includes supplying, by a high frequency RF generator, a high frequency RF signal to the IMN. The method includes accessing a plurality of measurement values of a variable measured at an output of the high frequency RF generator to generate a parameter. The variable is measured during a plurality of cycles of operation of a low frequency RF generator. The measurement values are associated with a plurality of values of power supplied by the high frequency RF generator. The method includes determining, for one of the cycles, a value of a frequency of the high frequency RF generator and a value of a factor associated with a shunt circuit of the IMN for which there is an increase in efficiency in power delivered by the high frequency RF generator.

40 Claims, 20 Drawing Sheets

(58) Field of Classification Search
CPC ............. H01J 37/3299; H01J 2237/332; H01J 2237/334; H01L 21/306; H05H 2001/4645
USPC .................. 315/111.01–111.91; 118/723
See application file for complete search history.

(56) References Cited

U.S. PATENT DOCUMENTS

2016/0308560 A1    10/2016   Howald et al.
2017/0178864 A1    6/2017    Valcore, Jr. et al.

\* cited by examiner (Lab) – Training
(For passive z MHz, *f* of z MHz, C1, &/or C2 controlled to achieve Fig. 4B from Fig. 4A & Fig. 4C from Fig. 4A)

(Over 1 cycle of x kHz)

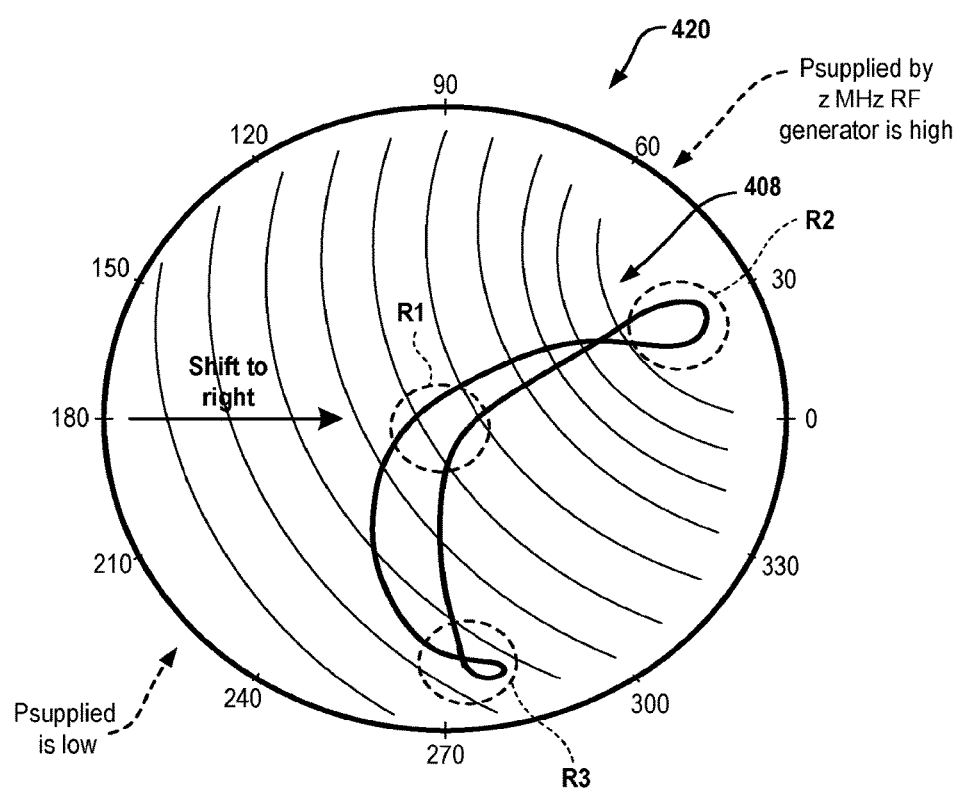
FIG. 4C (Power Contour)
(Passive)

(Lab) – Training
(For passive z MHz, $f$ of z MHz, C1, &/or C2 controlled to achieve Fig. 7B from Fig. 7A & Fig. 7C from Fig. 7A)

Passive　　　　　⟵ 600

For RFC21　　$f211$, C111 & C211 determined over multiple cycles of x kHz

| x kHz | PWR CTRL Passive Psupplied (z MHz) | z MHz | C1 | C2 | Γ |
|---|---|---|---|---|---|
| 1/5th of a cycle | | | | | |
| $f11$ | Ps6 | $f211$ | C111 | C211 | Γ6 |
| $f11$ | Ps7 | $f211$ | C111 | C211 | Γ7 |
| $f11$ | Ps8 | $f211$ | C111 | C211 | Γ8 |
| $f11$ | Ps9 | $f211$ | C111 | C211 | Γ9 |
| $f11$ | Ps10 | $f211$ | C111 | C211 | Γ10 |

1 Cycle of x kHz

Over multiple cycles of x kHz, determine $f211$, C111 & C211 for which $$\frac{[(Ps6)\times(\Gamma6)^2]+[(Ps7)\times(\Gamma7)^2]+[(Ps8)\times(\Gamma8)^2]+[(Ps9)\times(\Gamma9)^2]+[(Ps10)\times(\Gamma10)^2]}{5}$$

= Power-weighted average power reflect$^{\underline{n}}$ coefficient PWAPRC2 is low

FIG. 6

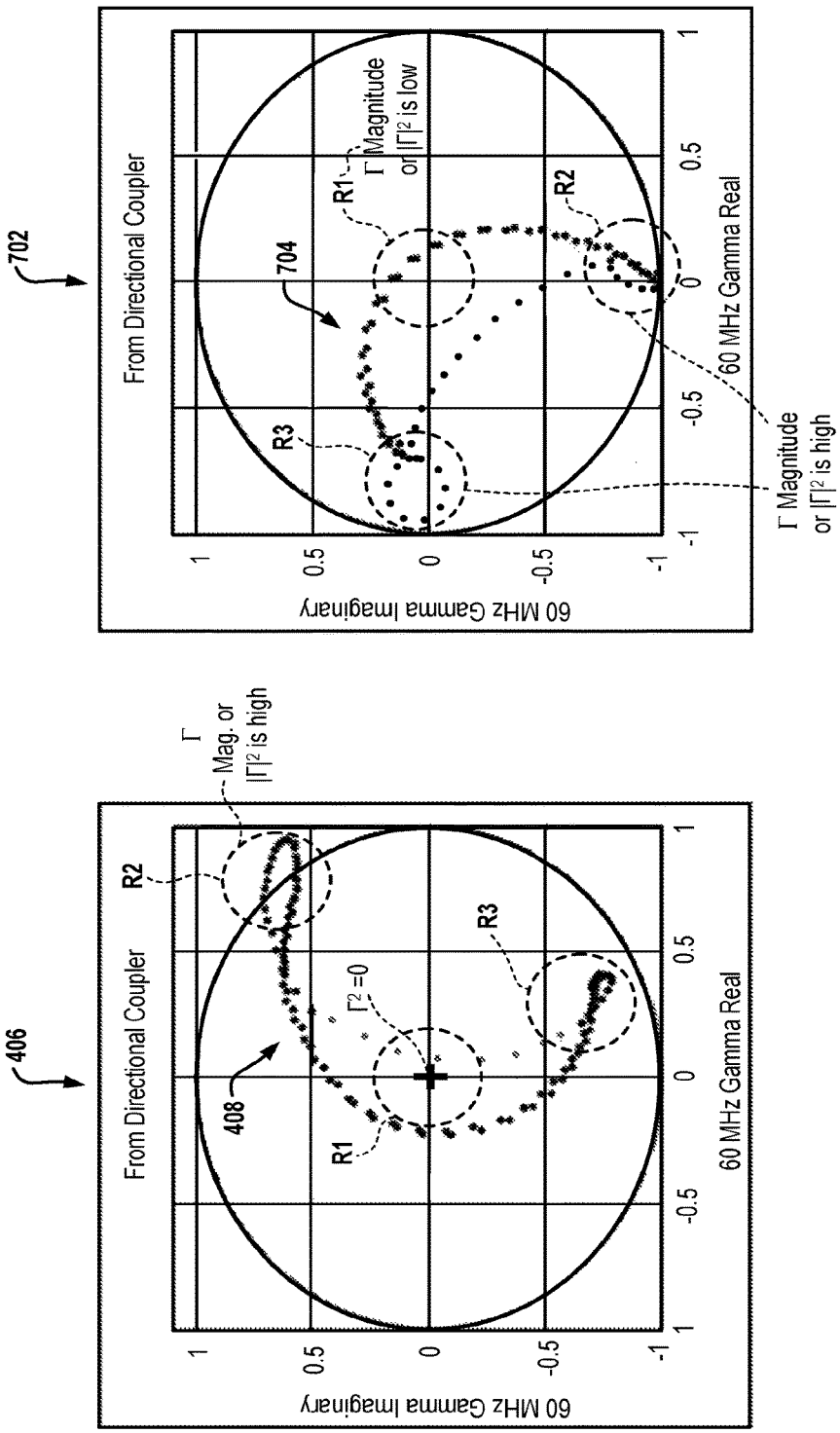

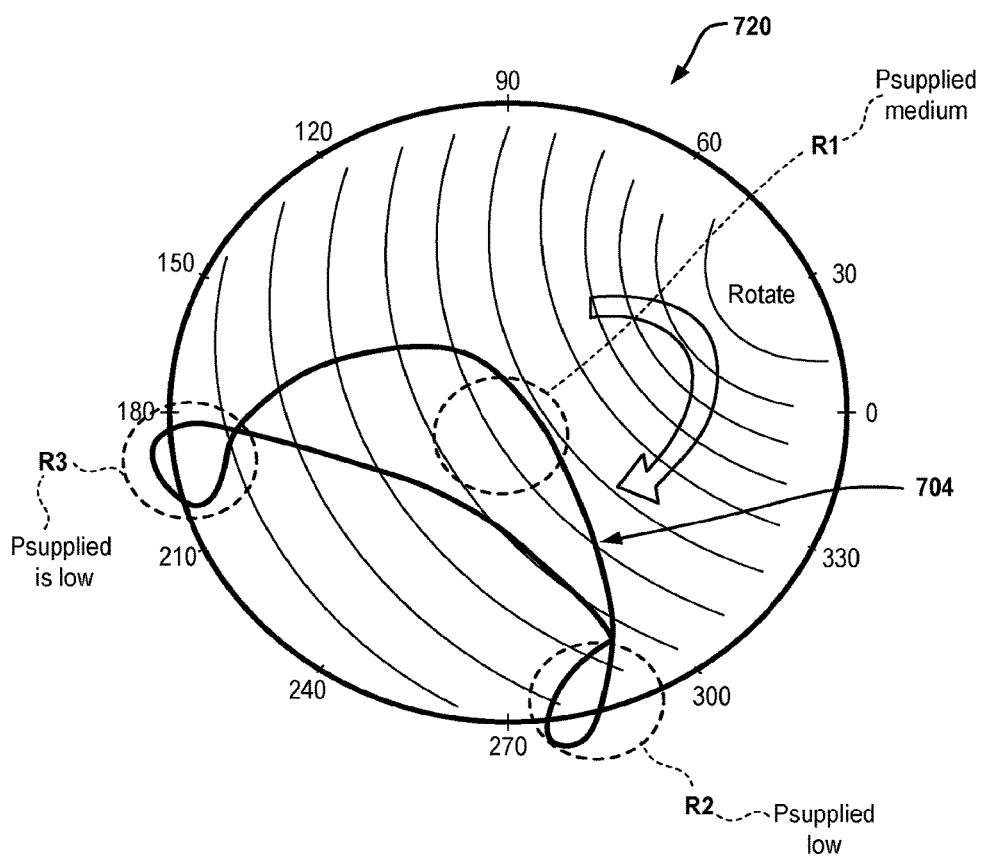
FIG. 7C (For RFC21)
(Power Contour)

(Process)
(For RFC21)

Passive — 810

| x kHz | PWR CTRL Passive Psupplied (z MHz) | z MHz | C1 | C2 |
|---|---|---|---|---|
| 1/5th of a cycle | | | | |
| ƒ11 | Ps6 | ƒ211 | C111 | C211 |
| ƒ11 | Ps7 | ƒ211 | C111 | C211 |
| ƒ11 | Ps8 | ƒ211 | C111 | C211 |
| ƒ11 | Ps9 | ƒ211 | C111 | C211 |
| ƒ11 | Ps10 | ƒ211 | C111 | C211 |

1/5th of a cycle

1 Cycle of x kHz

FIG. 8B
(Process)
(For RFC21)

(Process)
(For RFC2)

Passive — 910

| x kHz | PWR CTRL Passive Psupplied (z MHz) | z MHz | C1 | C2 |
|---|---|---|---|---|
| $f11$ | Ps1 | $f21$ | C11 | C21 |
| $f11$ | Ps2 | $f21$ | C11 | C21 |
| $f11$ | Ps3 | $f21$ | C11 | C21 |
| $f11$ | Ps4 | $f21$ | C11 | C21 |
| $f11$ | Ps5 | $f21$ | C11 | C21 |

1/5th of a cycle

1 Cycle of x kHz

FIG. 9B (Process)
(RFC2)

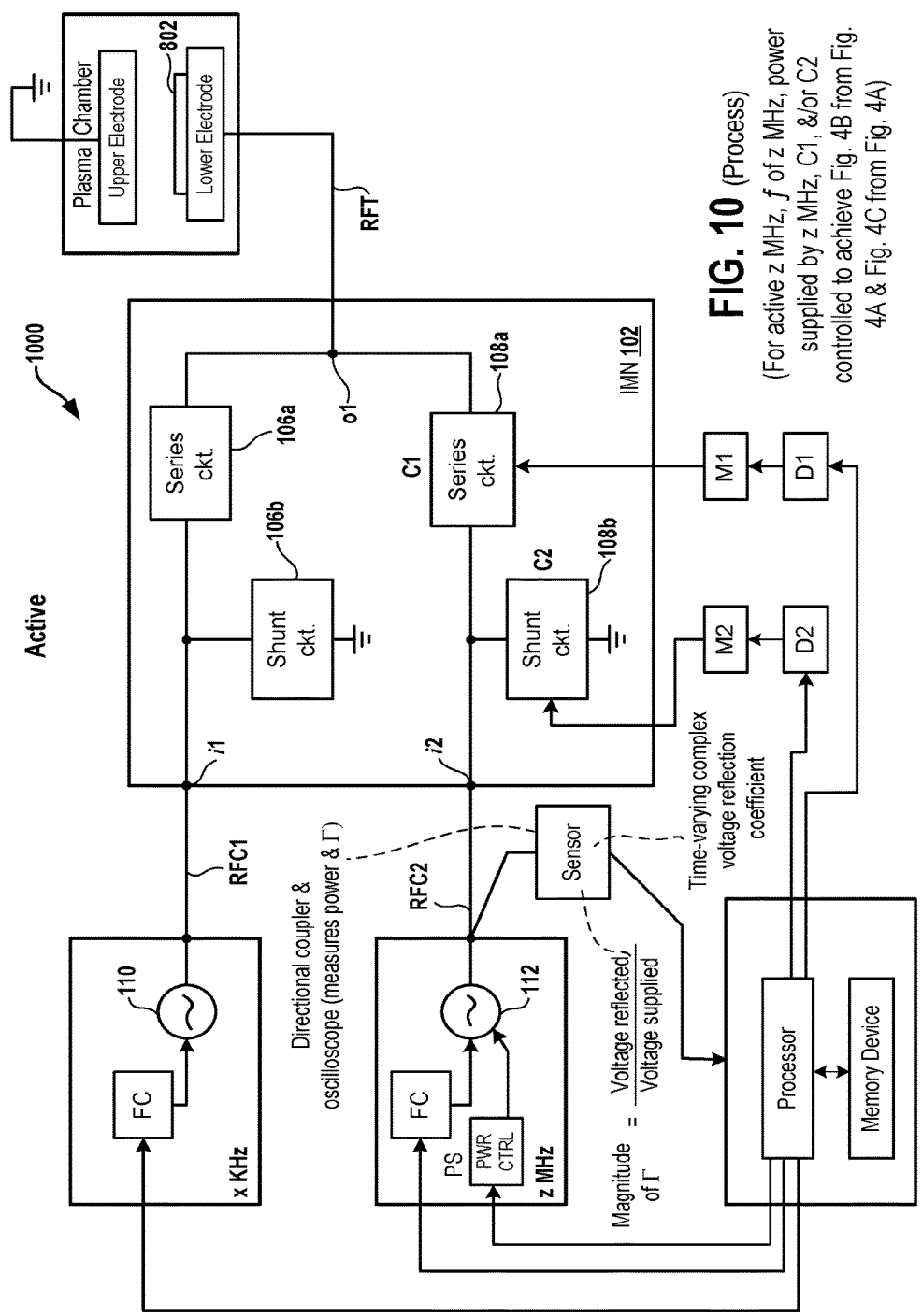
FIG. 10 (Process)
(For active z MHz, $f$ of z MHz, power supplied by z MHz, C1, &/or C2 controlled to achieve Fig. 4B from Fig. 4A & Fig. 4C from Fig. 4A)

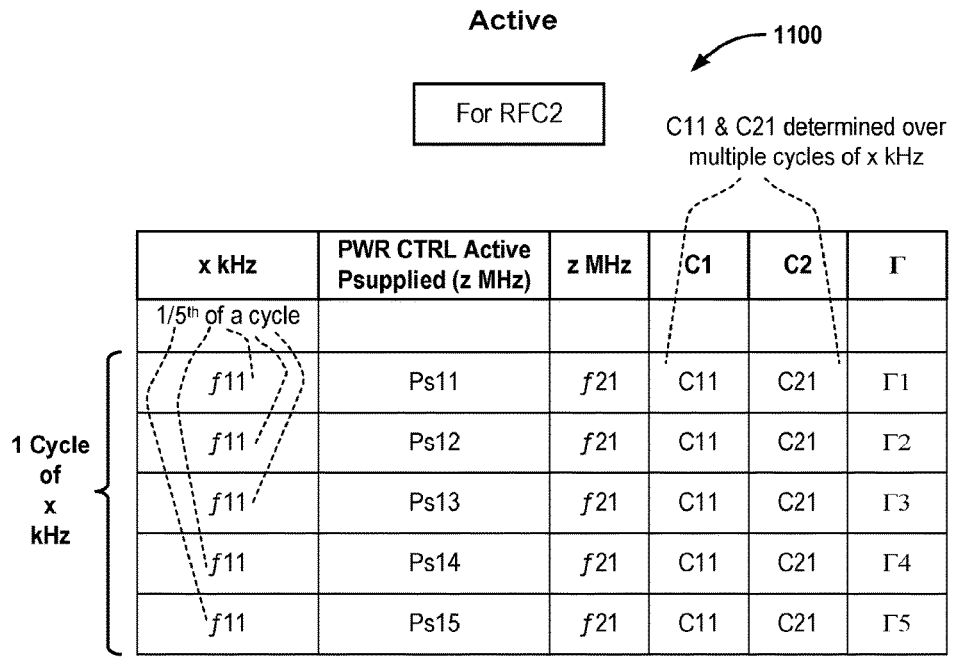

Active

For RFC2

1100

C11 & C21 determined over multiple cycles of x kHz

| x kHz | PWR CTRL Active Psupplied (z MHz) | z MHz | C1 | C2 | Γ |
|---|---|---|---|---|---|
| 1/5th of a cycle | | | | | |
| ƒ11 | Ps11 | ƒ21 | C11 | C21 | Γ1 |
| ƒ11 | Ps12 | ƒ21 | C11 | C21 | Γ2 |
| ƒ11 | Ps13 | ƒ21 | C11 | C21 | Γ3 |
| ƒ11 | Ps14 | ƒ21 | C11 | C21 | Γ4 |
| ƒ11 | Ps15 | ƒ21 | C11 | C21 | Γ5 |

1 Cycle of x kHz

Over multiple cycles of operation x kHz,
determine Ps11-Ps15, ƒ21, C11 & C21 for which $$\frac{[(Ps11)\times(\Gamma 1)^2]+[(Ps12)\times(\Gamma 2)^2]+[(Ps13)\times(\Gamma 3)^2]+[(Ps14)\times(\Gamma 4)^2]+[(Ps15)\times(\Gamma 5)^2]}{5}$$

= Power-weighted average power reflect$^n$ coefficient PWAPRC3 is low

FIG. 11

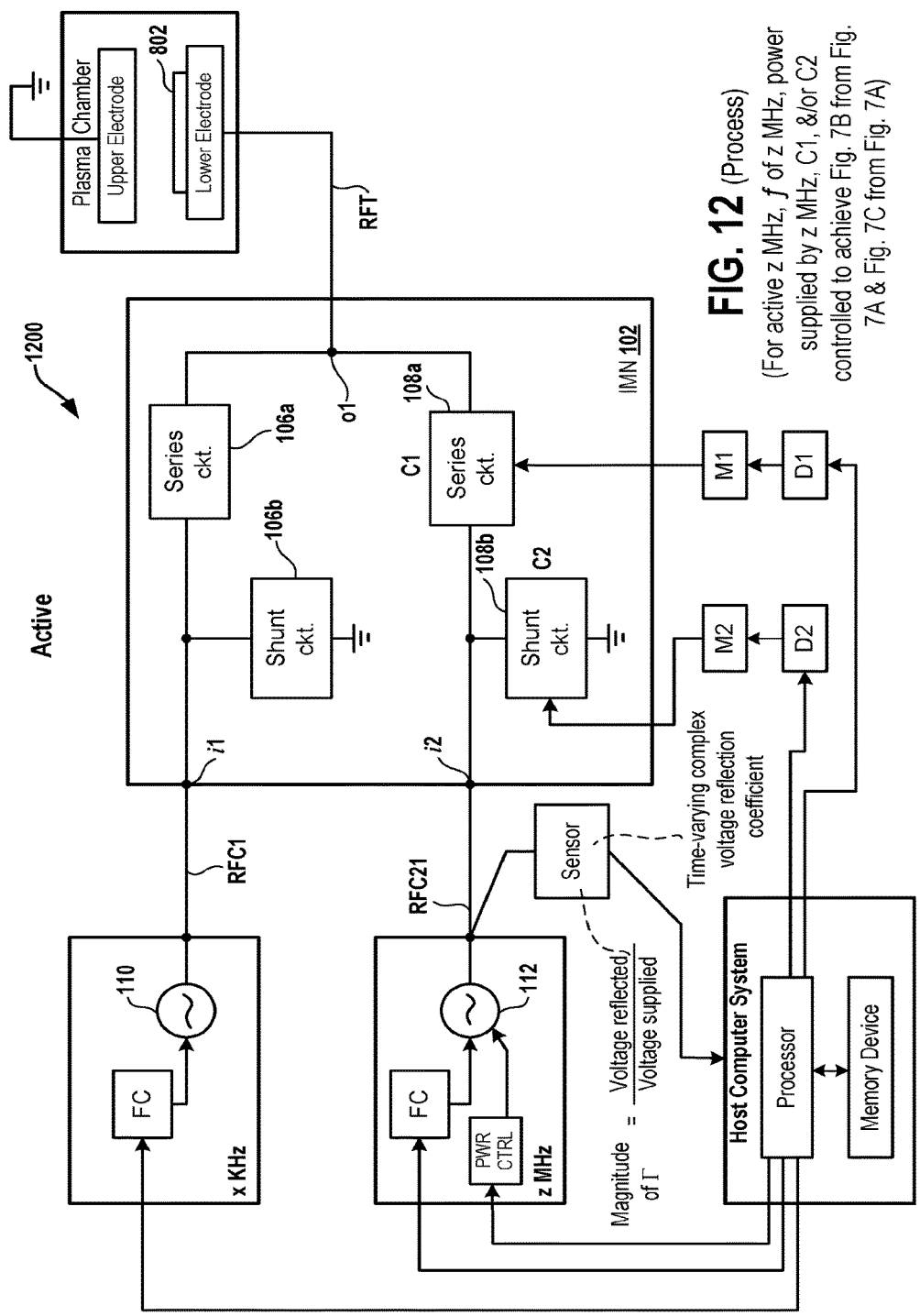

Active

For RFC21 — C111 & C211 determined over multiple cycles of x kHz

1300

| x kHz | PWR CTRL Active Psupplied (z MHz) | z MHz | C1 | C2 | Γ |
|---|---|---|---|---|---|
| 1/5th of a cycle | | | | | |
| $f11$ | Ps16 | $f211$ | C111 | C211 | $Γ6$ |
| $f11$ | Ps17 | $f211$ | C111 | C211 | $Γ7$ |
| $f11$ | Ps18 | $f211$ | C111 | C211 | $Γ8$ |
| $f11$ | Ps19 | $f211$ | C111 | C211 | $Γ9$ |
| $f11$ | Ps20 | $f211$ | C111 | C211 | $Γ10$ |

1 Cycle of x kHz

Over multiple cycles of x kHz,
determine Ps16-Ps20, $f211$, C111 & C211 for which $$\frac{[(Ps16) \times (Γ6)^2] + [(Ps17) \times (Γ7)^2] + [(Ps18) \times (Γ8)^2] + [(Ps19) \times (Γ9)^2] + [(Ps20) \times (Γ10)^2]}{5}$$

= Power-weighted average power reflect$^n$ coefficient PWAPRC4 is low

FIG. 13

Active (For RF cable RFC21)

1400

| x kHz | PWR CTRL active Psupplied (z MHz) | z MHz | C1 | C2 |
|---|---|---|---|---|
|  |  |  |  |  |
| $f11$ | Ps16 | $f211$ | C111 | C211 |
| $f11$ | Ps17 | $f211$ | C111 | C211 |
| $f11$ | Ps18 | $f211$ | C111 | C211 |
| $f11$ | Ps19 | $f211$ | C111 | C211 |
| $f11$ | Ps20 | $f211$ | C111 | C211 |

1 Cycle of x kHz

1/5th of a cycle

FIG. 14 (Process)

1500 → Active (For RF cable RFC2)

| | x kHz | PWR CTRL active Psupplied (z MHz) | z MHz | C1 | C2 |
|---|---|---|---|---|---|
| | | | | | |
| 1/5th of a cycle | f11 | Ps11 | f21 | C11 | C21 |
| | f11 | Ps12 | f21 | C11 | C21 |
| 1 Cycle of x kHz | f11 | Ps13 | f21 | C11 | C21 |
| | f11 | Ps14 | f21 | C11 | C21 |
| | f11 | Ps15 | f21 | C11 | C21 |

FIG. 15 (Process)

SYSTEMS AND METHODS FOR INCREASING EFFICIENCY OF DELIVERED POWER OF A MEGAHERTZ RADIO FREQUENCY GENERATOR IN THE PRESENCE OF A KILOHERTZ RADIO FREQUENCY GENERATOR

CLAIM OF PRIORITY

This application is a continuation of and claims the benefit of and priority, under 35 U.S.C. § 120, to application Ser. No. 15/655,808, filed on Jul. 20, 2017, and titled "SYSTEMS AND METHODS FOR INCREASING EFFICIENCY OF DELIVERED POWER OF A MEGAHERTZ RADIO FREQUENCY GENERATOR IN THE PRESENCE OF A KILOHERTZ RADIO FREQUENCY GENERATOR," which is hereby incorporated by reference in its entirety.

FIELD

The present embodiments relate to systems and methods for increasing efficiency of delivered power of a megahertz radio frequency generator in the presence of a kilohertz radio frequency generator.

BACKGROUND

A plasma tool is used to process a wafer. For example, a dielectric etch tool is used for depositing materials on or for etching the wafer. The plasma tool includes multiple radio frequency (RF) generators. The RF generators are connected to a match, which is further connected to a plasma chamber.

The RF generators generate RF signals that are provided via the match to the plasma chamber for processing the wafer. However, during processing of the wafer, a high amount of power is reflected towards one of the RF generators.

It is in this context that embodiments described in the present disclosure arise.

SUMMARY

Embodiments of the disclosure provide systems and methods for increasing efficiency of delivered power of a megahertz (MHz) radio frequency (RF) generator in the presence of a kilohertz (kHz) RF generator. It should be appreciated that the present embodiments can be implemented in numerous ways, e.g., a process, an apparatus, a system, a device, or a method on a computer-readable medium. Several embodiments are described below.

In one embodiment, power that is supplied by the MHz RF generator is changed within a cycle of the kHz RF generator to increase an efficiency of power delivered by the MHz RF generator. This power control is active, in which a high-speed power controller is used within the z MHz RF generator to quickly increase or decrease the power supplied by the MHz RF generator. The power controller increases or decreases the power supplied depending on whether a power reflection coefficient is low or high. In one embodiment, the power control is passive. One of naturally occurring properties of the MHz RF generator is that its supplied power is a function of impedance of plasma within a plasma chamber.

In an embodiment, in addition to the passive or active control of power of the MHz RF generator, a frequency of the power controller of the z MHz RF generator is controlled, a capacitor of an impedance matching network is controlled, and/or an RF cable that is coupled to the MHz RF generator is modified such that the supplied power of the MHz RF generator is high when a power reflection coefficient at an output of the MHz RF generator is low and the supplied power of the MHz RF generator is low when the power reflection coefficient is high.

Several dielectric plasma etch systems use z MHz, such as 60 MHz or 27 MHz, and x kHz, such as 400 kHz, as radio frequencies. A presence of a low frequency, such as x kHz, causes modulation in a high frequency, such as z MHz. The modulation is evident as power supplied by a z MHz RF generator at intermodulated frequencies, such as z MHz±n*x kHz, where n is a positive real number. Some RF systems measure power towards the z MHz RF generator at a fundamental frequency, such as z MHz, but as much as 50% of the z MHz RF power is reflected back to the z MHz RF generator at the intermodulated frequencies and is wasted as heat. It costs money to waste this much power, both as a cost of the power supplied by the z MHz RF generator and as cost of needing a larger RF generator to deliver a given amount of power.

Some methods include reducing the amount of z MHz reflected power and increasing an efficiency of z MHz delivered power, which is a ratio of power that is received by a plasma chamber and a sum of the power received by the plasma chamber and power reflected towards the z MHz RF generator. For example, a portion of power output from the z MHz RF generator is received and used by the plasma chamber for processing and another portion of the power output from the z MHz RF generator is reflected back towards the z MHz RF generator from the plasma chamber. The efficiency of z MHz delivered power is a ratio of the power received by the plasma chamber and a total of the power received by the plasma chamber and power reflected towards the z MHz RF generator. The power is reflected towards the z MHz RF generator from the plasma chamber via an RF transmission line, an impedance matching network and an RF cable. The impedance matching network is coupled to the plasma chamber via the RF transmission line and is coupled to the z MHz RF generator via the RF cable. The power received by the plasma chamber is power that is received at an electrode, such as a lower electrode, of the plasma chamber via the RF transmission line. One of the methods includes modulating the z MHz RF frequency, sometimes referred to herein as frequency modulation (FM), within a cycle of x kHz, and another one of the methods includes modulating the z MHz RF supplied power, sometimes referred to herein as amplitude modulation (AM), within a cycle of x kHz. In an embodiment, a method of utilizing naturally occurring passive modulation of the z MHz power supplied by the z MHz RF generator to implement the AM process is described.

On etch tools with z MHz and x kHz RF generators, a z MHz voltage reflection coefficient Γ is modulated by x kHz. The z MHz voltage reflection coefficient Γ is a complex number with magnitude and phase. For example, an average, over a cycle of x kHz, of the z MHz voltage reflection coefficient is 0 but an average, over a cycle of x kHz, of a z MHz power reflection coefficient $|\Gamma|^2$ is 0.50 or 50%. Hence, 50% of the power supplied by the z MHz RF generator is wasted. A larger z MHz RF generator can be used to increase the amount of the power supplied but is cost prohibitive.

As mentioned above, a method of improving the z MHz RF delivered power efficiency is to modulate the z MHz supplied power from the z MHz generator within a x kHz cycle. For example, the z MHz supplied power is increased during a part of the x kHz cycle when the power reflection coefficient $|\Gamma|^2$ is lower and the z MHz output power is decreased during a part of the x kHz cycle when the power reflection coefficient is higher. This would give an overall lower power weighted reflection coefficient. The increase and the decrease in the z MHz supplied power is achieved by actively controlling the z MHz supplied power on a sub-microsecond time scale. It should be noted that one period of the x kHz is 2.5 microseconds or ranges between 2 microseconds and 3 microseconds. Moreover, in an embodiment, the increase and the decrease in the z MHz supplied power is achieved by naturally occurring passive changes in z MHz output power instead of having to use the active control.

In one embodiment, a method that varies tuning knobs associated with an impedance matching network that is coupled to the x kHz RF generator and the z MHz RF generator is described. Examples of the tuning knobs include one variable capacitor and one variable RF frequency, or two variable capacitors. The tuning knobs are varied to shift a center of a trace, such as a plot, of the z MHz voltage reflection coefficient to more closely coincide with a center of a Smith chart. At the center of the Smith chart, the z MHz power reflection coefficient $|\Gamma|^2=0$.

In an embodiment, a method that varies a length of an RF cable between the z MHz RF generator and the impedance matching network is described. Such a change in the length facilitates a rotation of extreme regions, such as edge regions, of the z MHz voltage reflection coefficient trace to align with regions of lower amounts of power supplied by the z MHz RF generator. In addition, the change in the length facilitates a center region of the z MHz voltage reflection coefficient trace that has a high amount of power supplied by the z MHz RF generator to be near a center region of the Smith chart where $|\Gamma|^2$ is less.

In an embodiment, a method for increasing the z MHz delivered power efficiency by reducing a power-weighted average value of $|\Gamma|^2$ is described. The higher z MHz delivered power efficiency reduces operating cost of the power supplied by the z MHz RF generator and also reduces a capital cost of the z MHz RF generator, because the same amount of z MHz delivered power is achieved with the smaller z MHz RF generator.

In one embodiment, a method for passive control of an RF generator is described. The method includes supplying, by a low frequency RF generator, a low frequency RF signal to the impedance matching network coupled to a plasma chamber. The method further includes supplying, by a high frequency RF generator, a high frequency RF signal to the impedance matching network. The impedance matching network includes a series circuit and a shunt circuit. The method includes accessing a plurality of measurement values of a variable measured at an output of the high frequency RF generator to generate a parameter. The variable is measured during a plurality of cycles of operation of the low frequency RF generator. The measurement values are associated with a plurality of values of power supplied by the high frequency RF generator. The method includes determining, for one of the cycles, a value of a frequency of the high frequency RF generator and a value of a factor associated with the shunt circuit for which an efficiency of power delivered by the high frequency RF generator is increased.

In an embodiment, a method for active control of an RF generator is described. The method includes supplying, by a low frequency RF generator, a low frequency RF signal to the impedance matching network coupled to a plasma chamber. The method further includes supplying, by a high frequency RF generator, a high frequency RF signal to the impedance matching network. The impedance matching network includes a series circuit and a shunt circuit. The method further includes accessing a plurality of measurement values of a variable measured at an output of the high frequency RF generator to generate a parameter. The variable is measured during a plurality of cycles of operation of the low frequency RF generator. The measurement values are associated with a plurality of values of power supplied by the high frequency RF generator. The method includes determining, for one of the cycles, a value of a frequency of the high frequency RF generator, an amount of the power to be supplied by the high frequency RF generator, and a value of a factor associated with the shunt circuit for which an efficiency of power delivered by the high frequency RF generator is increased.

Several advantages of the herein described systems and methods include tuning the z MHz RF generator to increase an efficiency of power delivered by the z MHz RF generator. In an embodiment, the efficiency is increased by determining, during a training routine, a frequency of operation of the z MHz RF generator, a capacitance of a shunt capacitor of the impedance matching network, and a capacitance of a series capacitor of the impedance matching network. The frequency of operation of the z MHz RF generator, the capacitance of a shunt capacitor of the impedance matching network, and the capacitance of a series capacitor of the impedance matching network are determined for one of multiple cycles of operation of the x kHz RF generator. There is no control of power supplied by the z MHz RF generator within a cycle of operation of the x kHz RF generator when the frequency of operation of the z MHz RF generator, the capacitance of the shunt capacitor of the impedance matching network, and the capacitance of the series capacitor of the impedance matching network are determined. For example, power supplied by the z MHz RF generator is not controlled to be changed from one subcycle of a first cycle of operation of the x kHz RF generator to a second subcycle of the cycle of operation of the x kHz RF generator. Each cycle of operation of the x kHz RF generator is divided into multiple subcycles. The second subcycle is consecutive to the first subcycle. Such lack of control of the power supplied by the z MHz RF generator within the cycle of operation of the x kHz RF generator is sometimes referred to herein as the passive control. Moreover, during processing of a wafer, there is also no control of power supplied by the z MHz RF generator during the cycle of operation of the x kHz RF generator. During the processing of the wafer, the frequency of operation of the z MHz RF generator, the capacitance of the shunt capacitor of the impedance matching network, and the capacitance of the series capacitor of the impedance matching network determined during the training routine are applied.

It should be noted that the power supplied by the z MHz RF generator is controlled during the passive control, such as is controlled to change over multiple cycles of operation of the x kHz RF generator, but is not controlled to change within or during a cycle of operation of the x kHz RF generator. The power supplied by the z MHz RF generator is controlled, but just not on a fast time scale of a period, such as a cycle, of the x kHz RF generator. Moreover, during passive control, during each cycle of the x kHz RF generator, there is a change in voltage of an RF signal supplied by the x kHz RF generator. The change in the voltage modifies z MHz load impedance of plasma within a plasma chamber.

The modification in the z MHz load impedance of plasma changes an amount of power that is supplied by the z MHz RF generator.

In an embodiment, the efficiency in delivered power is increased by determining an amount of power to be supplied by the z MHz RF generator, a frequency of operation of the z MHz RF generator, a capacitance of the shunt capacitor of the impedance matching network, and a capacitance of the series capacitor of the impedance matching network. During processing of the wafer, the frequency of operation of the z MHz RF generator, the amount of power to be supplied by the z MHz RF generator, the capacitance of the shunt capacitor of the impedance matching network, and the capacitance of the series capacitor of the impedance matching network are determined for one of multiple cycles of operation of the x kHz RF generator. There is control of power of the z MHz RF generator within a cycle of operation of the x kHz RF generator when the frequency of operation of the z MHz RF generator, the amount of power to be supplied by the z MHz RF generator, the capacitance of the shunt capacitor of the impedance matching network, and the capacitance of the series capacitor of the impedance matching network are determined. Such control of the power supplied by the z MHz RF generator within the cycle of operation of the x kHz RF generator is sometimes referred to herein as the active control.

The increase in the efficiency in delivered power is achieved by using the active control or the passive control. The increase in the delivered power efficiency improves processing efficiency of the wafer within a plasma chamber.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 4C is an embodiment of a power contour to illustrate that the power supplied by the z MHz RF generator at an output of the z MHz RF generator is low at a lower left corner of the power contour and is high at an upper right corner of the power contour.

FIG. 6 is an embodiment of a table to illustrate an operation of the system of FIG. 5 during the training routine.

FIG. 7A is the Smith chart of FIG. 4B.

FIG. 7B is an embodiment of a Smith chart to illustrate that the power reflection coefficient is low to increase an efficiency in power delivered by the z MHz RF generator.

FIG. 7C is an embodiment of a power contour to illustrate that the power supplied by the z MHz RF generator at the output of the z MHz RF generator is higher for the changed RF cable compared to another RF cable of the system of FIG. 1.

FIG. 8B is an embodiment of a table to illustrate the processing routine of the system of FIG. 8A.

FIG. 9B is an embodiment of a table to illustrate the processing routine of the system of FIG. 9A.

FIG. 10 is a diagram of an embodiment of a system for illustrating an active control of the z MHz RF generator during multiple cycles of operation of the x kHz RF generator.

FIG. 11 is an embodiment of a table to illustrate an operation of the system of FIG. 10.

FIG. 12 is a diagram of an embodiment of a system in which the changed RF cable is used for the active control.

FIG. 13 is an embodiment of a table to illustrate an operation of the system of FIG. 12.

FIG. 14 is an embodiment of a table to illustrate a processing routine for the system of FIG. 12 in which the changed RF cable is used once a power value to be output by the z MHz RF generator, a frequency of operation of the z MHz RF generator, a capacitance of the shunt circuit of the impedance matching network, and another capacitance of the series circuit of the impedance matching network are identified for the active control.

FIG. 15 is an embodiment of a table to illustrate a processing routine of the system of FIG. 10 once a power value to be output by the z MHz RF generator, a frequency of operation of the z MHz RF generator, a capacitance of the shunt circuit of the impedance matching network, and another capacitance of the series circuit of the impedance matching network are identified.

DETAILED DESCRIPTION

The following embodiments describe systems and methods for increasing efficiency of delivered power of a megahertz radio frequency generator in the presence of a kilohertz radio frequency generator. It will be apparent that the present embodiments may be practiced without some or all of these specific details. In other instances, well known process operations have not been described in detail in order not to unnecessarily obscure the present embodiments.

Figure 1:
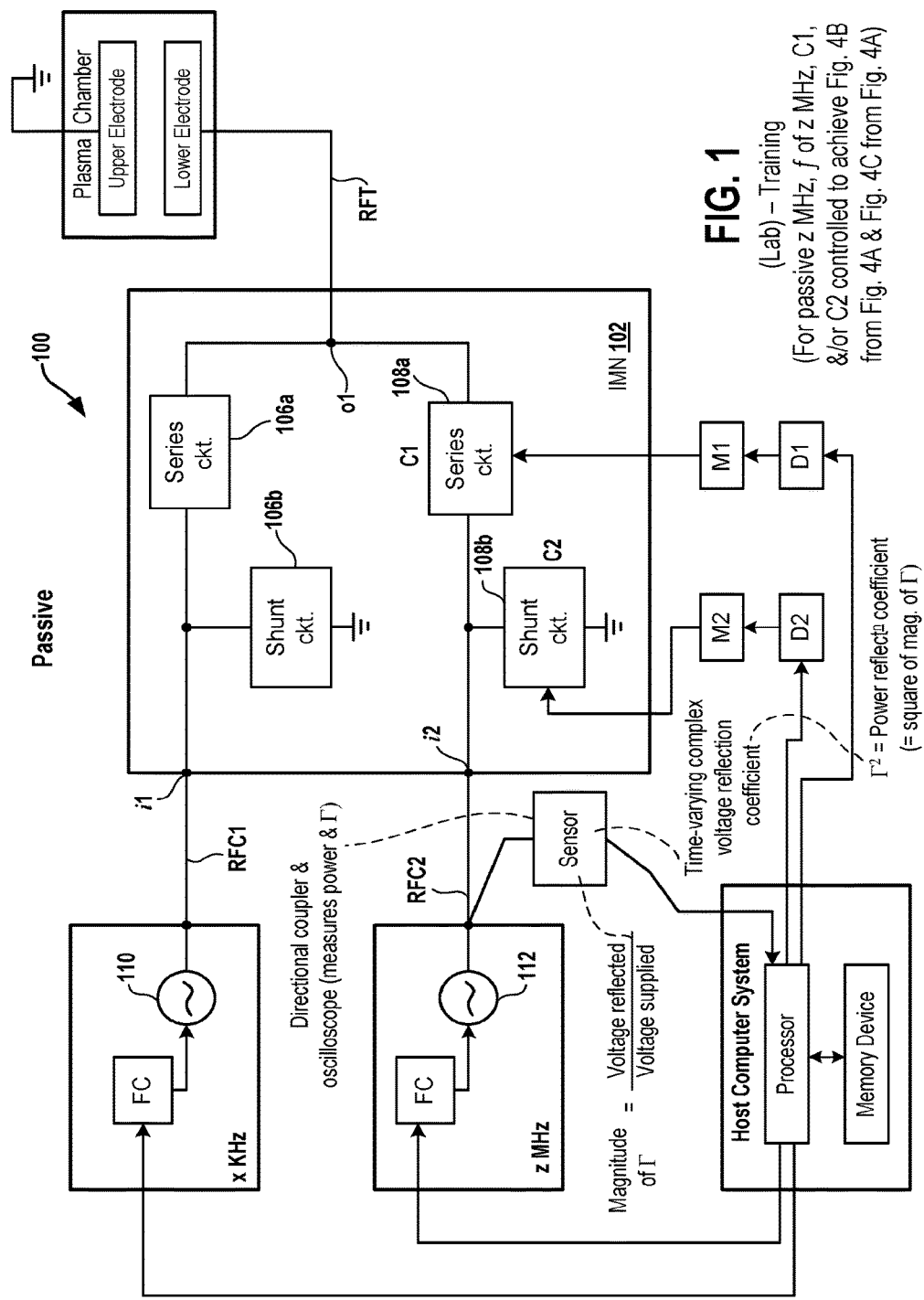
FIG. 1 is a diagram of an embodiment of a system for illustrating a training routine for passive control of a z megahertz (MHz) radio frequency (RF) generator during a cycle of operation of an x kilohertz (kHz) RF generator.

FIG. 1 is a diagram of an embodiment of a system 100 for illustrating a training routing for passive control of a z megahertz (MHz) radio frequency (RF) generator. The system 100 includes an x kilohertz (kHz) RF generator, the z MHz RF generator, a host computer system, an impedance matching network (IMN) 102, a plasma chamber, multiple motors M1 and M2, and multiple drivers D1 and D2. An example of a driver includes one or more transistors. A motor includes a stator and a rotor.

An example of the x kHz RF generator includes a 400 kHz RF generator. Another example of the x kHz RF generator includes a generator that has an operating frequency ranging between 300 kHz and 500 kHz. An example of the z MHz RF generator includes a generator having an operating frequency of 60 MHz. Another example of the z MHz RF generator includes an RF generator having an operating frequency of 27 MHz.

The IMN 102 includes a series circuit 106a, a shunt circuit 106b, another series circuit 108a, and another shunt circuit 108b. An example of a series circuit includes one or more resistors, one or more inductors, one or more capacitors, or a combination thereof. To illustrate, the series circuit includes a series combination of an inductor and a capacitor. As another illustration, the series circuit includes a series combination of an inductor, a capacitor, and a resistor. Similarly, an example of a shunt circuit includes a resistor, an inductor, a capacitor, or a combination thereof. To illustrate, the shunt circuit includes a series combination of an inductor and a capacitor. As another illustration, the shunt circuit includes a series combination of an inductor, a capacitor, and a resistor. An end of the shunt circuit is coupled to a ground connection.

A capacitor C1 of the one or more capacitors of the series circuit 108a has a combined capacitance of the one or more capacitors of the series circuit 108a. For example, when two capacitors are coupled to each other in parallel, the combined capacitance is a sum of capacitances of the two capacitors. As another example, when two capacitors are coupled to each other in series, the combined capacitance is a product of the capacitances divided by a sum of the capacitances. Similarly, a capacitor C2 of the shunt circuit 108b has a combined capacitance of the one or more capacitors of the shunt circuit 108b.

An end of the series circuit 106a is coupled to an end of the shunt circuit 106b. Both of the ends of the series circuit 106a and the circuit 106b are coupled to an input i1 of the IMN 102. Similarly, an end of the series circuit 108a is coupled to an end of the shunt circuit 108b. Both of the ends of the series circuit 108a and the shunt circuit 108b are coupled to an input i2 of the IMN 102. Moreover, an opposite end of the series circuit 106a is coupled to an output o1 of the IMN 102. Similarly, an opposite end of the series circuit 108a is coupled to the output o1. The input i1 is coupled via an RF cable RFC1 to an output of the x kHz RF generator. Similarly, the input i2 is coupled via an RF cable RFC2 to an output of the z MHz RF generator.

The plasma chamber includes a lower electrode and an upper electrode. The upper electrode is coupled to a ground potential. Each of the lower electrode and the upper electrode is made of a metal, e.g., anodized aluminum, alloy of aluminum, etc. The upper electrode faces the lower electrode and a gap is formed between the upper electrode and the lower electrode for plasma to form within the gap. In some embodiments, the plasma chamber includes additional parts, such as, an upper electrode extension that surrounds the upper electrode, a dielectric ring between the upper electrode and the upper electrode extension, confinement rings located besides edges of the upper electrode, a lower electrode extension that surrounds the lower electrode, and a dielectric ring between the lower electrode and the lower electrode extension, etc.

The output of is coupled to the lower electrode via an RF transmission line RFT. The RF transmission line RFT includes an RF rod and an insulator sleeve that surrounds the RF rod.

The host computer system includes a processor and a memory device. The memory device is coupled to the processor. Examples of the processor include a central processing unit (CPU), a controller, an application specific integrated circuit (ASIC), or a programmable logic device (PLD), and these terms are used interchangeably herein. Examples of the memory device include a read-only memory (ROM), a random access memory (RAM), a hard disk, a volatile memory, a non-volatile memory, a redundant array of storage disks, a Flash memory, etc.

The system 100 further includes a sensor, such as a directional coupler and an oscilloscope, or a network analyzer, that is coupled to an output of the z MHz RF generator. The sensor measures a variable, such as a voltage reflection coefficient $\Gamma$ or supplied power. The variable is measured in the system 100 during the training routine in which there is no processing of a substrate. For example, the plasma chamber lacks the substrate for processing when the variable is measured by the sensor. As another example, a dummy wafer is used in the plasma chamber. The voltage reflection coefficient $\Gamma$ is a complex number, such as has a magnitude and a phase. Moreover, the voltage reflection coefficient $\Gamma$ varies with time. The magnitude of the voltage reflection coefficient $\Gamma$ is a ratio of voltage that is reflected towards the z MHz RF generator at the output of the z MHz RF generator and voltage that is supplied by the z MHz RF generator at the output. The voltage is reflected towards the z MHz RF generator from the plasma chamber via the RF transmission line RFT, the IMN 102, and the RF cable RFC2. A power reflection coefficient $|\Gamma|^2$, which is an example of a parameter, is a square of the magnitude of the voltage reflection coefficient $\Gamma$.

The processor receives measured values of the variable and calculates a square of a magnitude of each of the measured values to generate a corresponding value of the parameter. The processor is coupled to the driver D1, which is further coupled to the motor M1. The motor M1 is coupled to the capacitor C1 via a connection mechanism. An example of a connection mechanism includes one or more rods, or a combination of one or more rods and one or more gears. Similarly, the processor is coupled to the driver D2, which is further coupled to the motor M2. The motor M2 is coupled to the capacitor C2 via another connection mechanism.

The x kHz RF generator includes a frequency controller (FC) and a power supply 110. The power supply 110 is coupled to the FC of the x kHz RF generator and to the output of the x kHz RF generator. An example of an FC includes a controller. Moreover, the z MHz RF generator includes an FC and a power supply 112. The power supply 112 is coupled to the FC of the z MHz RF generator and to the output of the z MHz RF generator.

In one embodiment, instead of being coupled to the lower electrode, the RF transmission line RFT is coupled to the upper electrode and the lower electrode is coupled to a ground connection. In an embodiment, the upper electrode is coupled to another RF generator via another RF transmission line and another impedance matching network and the lower electrode is coupled to the IMN 102.

Figure 2:
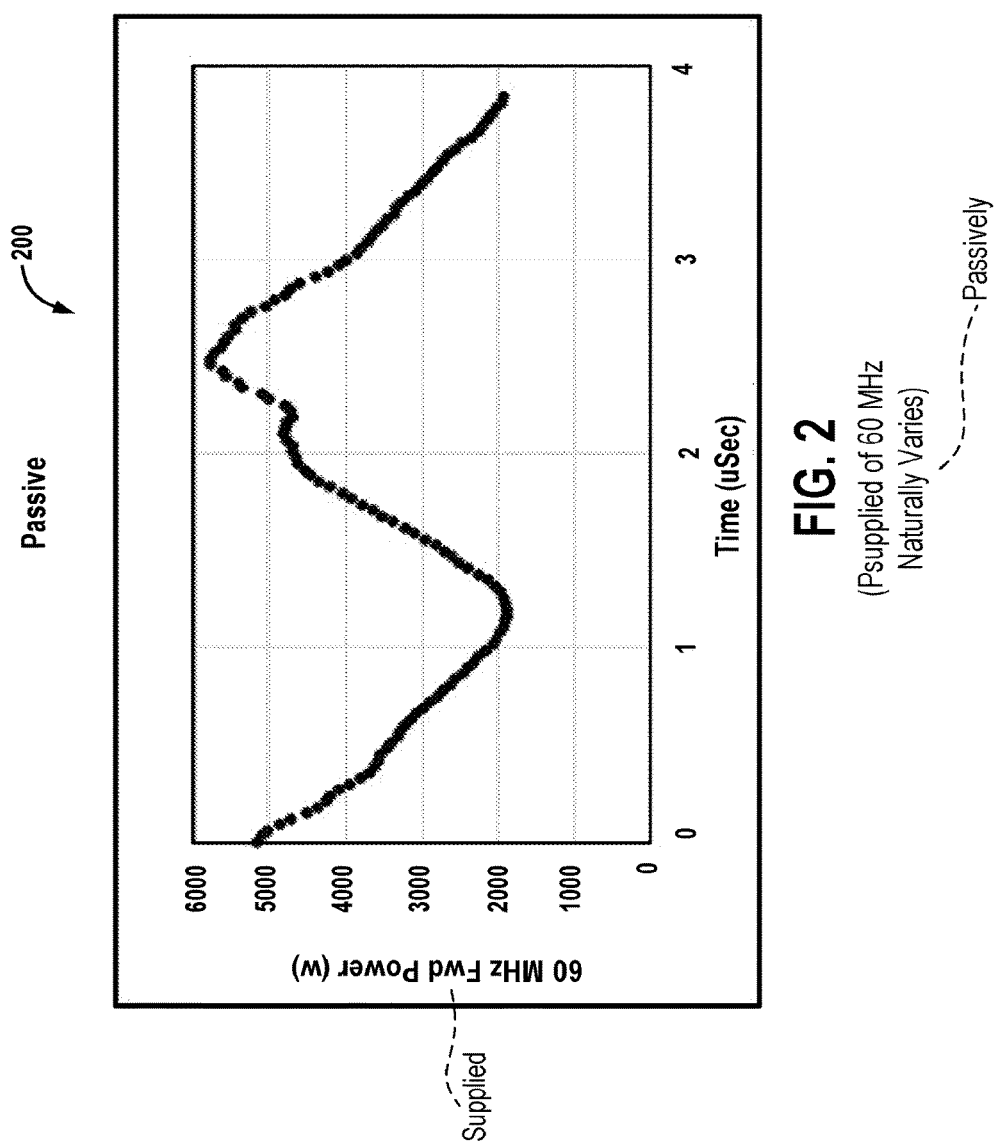
FIG. 2 is a diagram of an embodiment of a graph to illustrate that there is a passive variation of power that is supplied by the z MHz RF generator.

FIG. 2 is a diagram of an embodiment of a graph 200 that there is a passive, such as without being controlled by the processor during a cycle of operation of the x kHz RF generator, or normal, or operational, variation of power that is supplied by the z MHz RF generator. The power that is supplied by the z MHz RF generator is sometimes referred to herein as supplied power. The graph 200 plots the power supplied by the z MHz RF generator versus time. As illustrated in the graph 200, the supplied power varies between 2000 watts and 5500 watts. Within a cycle of operation of the x kHz RF generator, there is no control of the z MHz RF generator by the processor to change the power that is supplied at the output of the z MHz RF generator. The power supplied at the output of the z MHz RF generator varies without being controlled during a cycle of operation of the x kHz RF generator.

Figure 3:
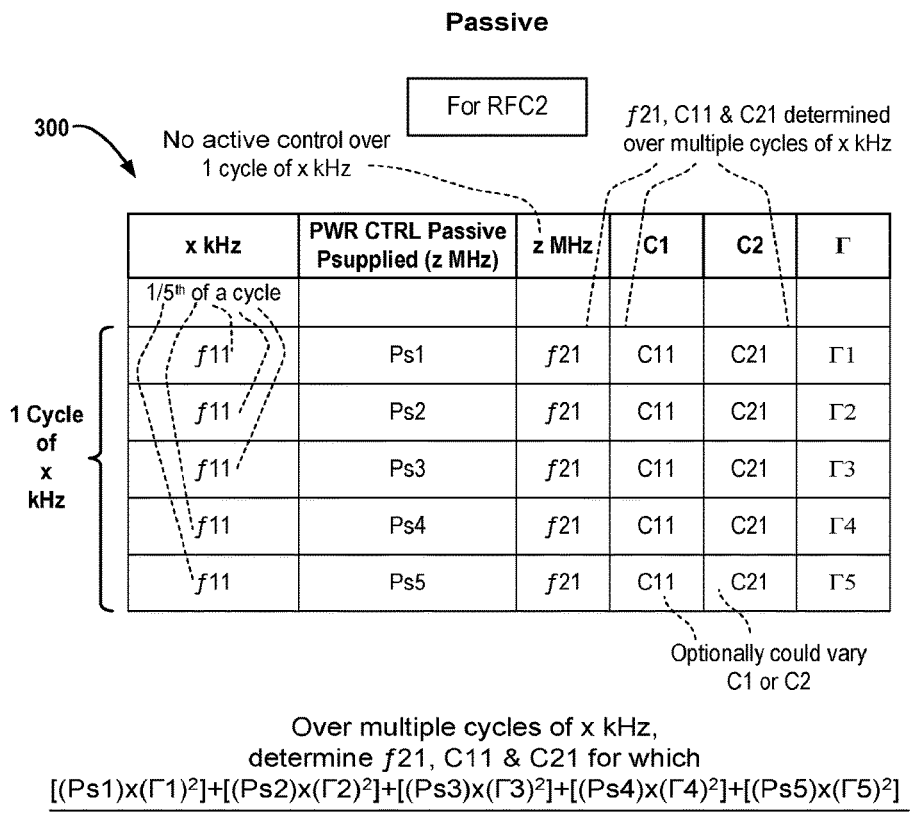
FIG. 3 is an embodiment of a table to illustrate an operation of the system of FIG. 1 during the training routine.

FIG. 3 is an embodiment of a table 300 to illustrate an operation of the system 100 of FIG. 1 during the training routine. As shown in the table 300, the x kHz RF generator has a cycle that has a frequency of f11. Each cycle of operation of the x kHz RF generator has the frequency f11. For example, a first one-fifth of the cycle of operation of the x kHz RF generator has the frequency of f11, a second one-fifth of the cycle of operation of the x kHz RF generator has the frequency of f11, a third one-fifth of the cycle of operation of the x kHz RF generator has the frequency of f11, a fourth one-fifth of the cycle of operation of the x kHz RF generator has the frequency of f11, and a fifth one-fifth of the cycle of operation of the x kHz RF generator has the frequency of f11. The second one-fifth subcycle is consecutive to the first one-fifth subcycle. The third one-fifth subcycle is consecutive to the second one-fifth subcycle. The fourth one-fifth subcycle is consecutive to the third one-fifth subcycle. The fifth one-fifth subcycle is consecutive to the fourth one-fifth subcycle. The processor of the host computer system provides the frequency f11 of operation of the x kHz RF generator to the FC of the x kHz RF generator. The FC provides the frequency f11 to the power supply 110 and the power supply 110 generates an RF signal having the frequency f11 during the cycle of operation of the x kHz RF generator. A cycle is a cycle of a clock signal. The clock signal has multiple cycles. Each cycle has one and the same time period. Similarly, each subcycle has one and the same time period.

When the x kHz RF generator operates at the frequency f11 during the training routine, the power supply 112 of the z MHz RF generator supplies power values ranging from Ps1 through Ps5. There is no control of the z MHz RF generator to provide the power values Ps1 through Ps5 during a cycle of operation of the x kHz RF generator. For example, there is no feedback loop to the processor of the host computer system to control the power values Ps1 through Ps5 during a cycle of operation of the x kHz RF generator. To further illustrate, within a cycle of operation of the x kHz RF generator, the processor does not change the power values Ps1 through Ps5 based on measured values of the variable that are received from the sensor that is coupled to the output of the z MHz RF generator. As another illustration, power supplied by the z MHz RF generator at the output of the z MHz RF generator varies on its own during an open loop operation, such as within a cycle in an order of microseconds of operation, of the x kHz RF generator. As an example, a time period of occurrence of the cycle of the x kHz RF generator ranges between 2 and 5 microseconds, such as 2.5 microseconds.

The z MHz RF generator is operated at a frequency of f21 during the cycle of the x kHz RF generator. For example, the processor of the host computer system provides the frequency f21 of operation of the z MHz RF generator to the FC of the z MHz RF generator. The FC of the z MHz RF generator provides the frequency f21 to the power supply 112 to operate the power supply 112 to generate an RF signal having the frequency f21 during the cycle of operation of the x kHz RF generator.

The power supply 110 generates an RF signal having the frequency f11 and the power supply 112 generates another RF signal having the frequency f21 during the cycle of operation of the x kHz RF generator. The RF signal generated by the power supply 110 and having the frequency f11 is sent from the output of the x kHz RF generator via the RF cable RFC1 to the input i1 of the IMN 102. Similarly, the RF signal, generated by the power supply 112, having the frequency f21 and having the power amounts Ps1 through Ps5 is sent from the output of the z MHz RF generator via the RF cable RFC2 to the input i2 of the IMN 102. The IMN 102 matches an impedance of a load, such as the RF transmission line RFT and the plasma chamber, coupled to the output of with that of a source, such as the RF cables RFC1 and RFC2 and the x kHz and z MHz RF generators, coupled to the inputs i1 and i2 and combines at the output o1 the RF signals received from the x kHz RF generator and the z MHz RF generator to generate a modified RF signal. The modified RF signal is sent from the output o1 via the RF transmission line RFT to the lower electrode.

Moreover, the capacitor C1 of the series circuit 108a is controlled to have a capacitance value C11 during the cycle of operation of the x kHz RF generator. For example, the processor of the host computer system sends a command signal to the driver D1 to achieve a value of an area between plates of the capacitor C1. The driver D1 generates a drive signal based on the command signal and sends the drive signal to the motor M1. The rotor of the motor M1 rotates based on the drive signal to move the connection mechanism that is coupled to the motor M1 to further achieve the area between the plates of the capacitor C1. When the area between the plates of the capacitor C1 is achieved, the capacitor C1 has the capacitance C11. A capacitance is an example of a factor, as used herein.

Similarly, the capacitor C2 of the shunt circuit 108b is controlled to have a capacitance value C21 during the cycle of operation of the x kHz RF generator. For example, the processor of the host computer system sends a command signal to the driver D2 to achieve a value of an area between plates of the capacitor C2. The driver D2 generates a drive signal based on the command signal and sends the drive signal to the motor M2. The rotor of the motor M2 rotates based on the drive signal to move the connection mechanism that is coupled to the motor M2 to further achieve the area between the plates of the capacitor C2. When the area between the plates of the capacitor C2 is achieved, the capacitor C2 has the capacitance C21.

When the frequency of operation of the x kHz RF generator is f11, the frequency of operation of the z MHz RF generator is f21, the power supplied by the z MHz RF generator is Ps1, the value of capacitance of the capacitor C1 is C11, and the value of capacitance of the capacitor C2 is C21, the sensor measures the voltage reflection coefficient to be Γ1 at the output of the z MHz RF generator. Similarly, when the frequency of operation of the x kHz RF generator is f11, the frequency of operation of the z MHz RF generator is f21, the power supplied by the z MHz RF generator is Ps2, the value of capacitance of the capacitor C1 is C11, and the value of capacitance of the capacitor C2 is C21, the sensor measures the voltage reflection coefficient to be Γ2 at the output of the z MHz RF generator. Furthermore, when the frequency of operation of the x kHz RF generator is f11, the frequency of operation of the z MHz RF generator is f21, the power supplied by the z MHz RF generator is Ps3, the value of capacitance of the capacitor C1 is C11, and the value of capacitance of the capacitor C2 is C21, the sensor measures the voltage reflection coefficient to be Γ3 at the output of the z MHz RF generator. Also, when the frequency of operation of the x kHz RF generator is f11, the frequency of operation of the z MHz RF generator is f21, the power supplied by the z MHz RF generator is Ps4, the value of capacitance of the capacitor C1 is C11, and the value of capacitance of the capacitor C2 is C21, the sensor measures the voltage reflection coefficient to be Γ4 at the output of the z MHz RF generator. When the frequency of operation of the x kHz RF generator is f11, the frequency of operation of the z MHz RF generator is f21, the power supplied by the z MHz RF generator is Ps5, the value of capacitance of the capacitor C1 is C11, and the value of capacitance of the capacitor C2 is C21, the sensor measures the voltage reflection coefficient to be Γ5 at the output of the z MHz RF generator.

The sensor also measures the power values Ps1 through Ps5 at the output of the z MHz RF generator. The sensor provides the values Γ1 through Γ5 and the values Ps1 through Ps5 to the processor via a transfer cable, such as a serial data transfer cable, a parallel data transfer cable, and a universal serial bus (USB) cable. The processor stores the value f11, the values Ps1 through Ps5, the value f21, the value C11, the value C21, and the values Γ1 through Γ5 in the table 300, which is stored in the memory device. In one embodiment, the processor stores the value f11, the values Ps1 through Ps5, the value f21, the value C11, the value C21, and the values Γ1 through Γ5 in a table 910 of FIG. 9B and stores the table 910 in the memory device.

The processor calculates a power-weighted average power reflection coefficient (PWAPRC) for the cycle of the x kHz RF generator. For example, the processor calculates a PWARPC1 for the cycle of the x kHz RF generator to be $[\{(Ps1) \times (|\Gamma1|)^2\} + \{(Ps2) \times (|\Gamma2|)^2\} + \{(Ps3) \times (|\Gamma3|)^2\} + \{(Ps4) \times (|\Gamma4|)^2\} + \{(Ps5) \times (|\Gamma5|)^2\}]/5$. The cycle of operation for which the value PWARPC1 of the power-weighted average power reflection coefficient is calculated is referred to herein as a first cycle of operation.

Similarly, the processor calculates another power-weighted average power reflection coefficient PWARPCa for a second cycle of operation of the x kHz RF generator. For example, the processor calculates the PWARPCa to be $[\{(Ps1a) \times (|\Gamma1a|)^2\} + \{(Ps2a) \times (|\Gamma2a|)^2\} + \{(Ps3a) \times (|\Gamma3a|)^2\} + \{(Ps4a) \times (|\Gamma4a|)^2\} + \{(Ps5a) \times (|\Gamma5a|)^2\}]/5$. It should be noted that the second cycle of operation of the x kHz RF generator occurs after an occurrence of the first cycle of operation of the x kHz RF generator. For example, the second cycle of operation occurs after one or more cycles of operation of the x kHz RF generator and the one or more cycles follow the first cycle of operation of the x kHz RF generator. Moreover, when the frequency of operation of the x kHz RF generator is f11, the frequency of operation of the z MHz RF generator is f21a, the power supplied by the z MHz RF generator is Ps1a, the value of capacitance of the capacitor C1 is C11a, and the value of capacitance of the capacitor C2 is C21a, the sensor measures the voltage reflection coefficient to be Γ1a at the output of the z MHz RF generator. Similarly, when the frequency of operation of the x kHz RF generator is f11, the frequency of operation of the z MHz RF generator is f21a, the power supplied by the z MHz RF generator is Ps2a, the value of capacitance of the capacitor C1 is C11a, and the value of capacitance of the capacitor C2 is C21a, the sensor measures the voltage reflection coefficient to be Γ2a at the output of the z MHz RF generator. Furthermore, when the frequency of operation of the x kHz RF generator is f11, the frequency of operation of the z MHz RF generator is f21a, the power supplied by the z MHz RF generator is Ps3a, the value of capacitance of the capacitor C1 is C11a, and the value of capacitance of the capacitor C2 is C21a, the sensor measures the voltage reflection coefficient to be Γ3a at the output of the z MHz RF generator. Also, when the frequency of operation of the x kHz RF generator is f11, the frequency of operation of the z MHz RF generator is f21a, the power supplied by the z MHz RF generator is Ps4a, the value of capacitance of the capacitor C1 is C11a, and the value of capacitance of the capacitor C2 is C21a, the sensor measures the voltage reflection coefficient to be Γ4a at the output of the z MHz RF generator. When the frequency of operation of the x kHz RF generator is f11, the frequency of operation of the z MHz RF generator is f21a, the power supplied by the z MHz RF generator is Ps5a, the value of capacitance of the capacitor C1 is C11a, and the value of capacitance of the capacitor C2 is C21a, the sensor measures the voltage reflection coefficient to be Γ5a at the output of the z MHz RF generator.

During the second cycle of operation of the x kHz RF generator, the power supply 110 generates an RF signal having the frequency f11 and the power supply 112 generates another RF signal having the frequency f21a. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f21a and having the power amounts Ps1a through Ps5a is sent from the output of the z MHz RF generator via the RF cable RFC2 to the input i2 of the IMN 102. The IMN 102 matches an impedance of the load coupled to the output o1 with that of a source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode.

Over multiple cycles of operation of the x kHz RF generator, the processor determines a value of the frequency of operation of the z MHz RF generator, a capacitance of the capacitor C1, and a capacitance of the capacitor C2 for which efficiency of the power delivered by the z MHz RF generator increases. For example, the processor determines which one of the values PWARPC1 and PWARPCa is low. The processor compares the value PWARPC1 with the value PWARPCa to determine that the value PWARPC1 is lower than the value PWARPCa. The efficiency of the power delivered by the z MHz RF generator increases during the first cycle for which the value PWARPC1 is computed. The processor identifies from the table 300 the value f21 of the frequency of operation of the z MHz RF generator during the first cycle, the capacitance C11 of the capacitor C1, and the capacitance C21 of the capacitor C2 for which the efficiency in delivered power is increased. It should be noted that the efficiency in delivered power is increased when the RF cable RFC2 is used to connect the output of the z MHz RF generator to the input i2 of the IMN 102.

In an embodiment, instead of controlling both the capacitors C1 and C2 to determine capacitances of the capacitors C1 and C2 for which the efficiency in the power delivered by the z MHz RF generator is increased, either the capacitor C1 or the capacitor C2 is controlled to determine a capacitance of the capacitor for which the efficiency in the power delivered by the z MHz RF generator is increased. For example, the value PWARPCa is achieved without controlling the capacitor C1 to have the value C11a. A capacitance of the capacitor C1 is maintained to have the value C11 and the value PWARPCa is achieved based on the capacitance C11 instead of the capacitance C11a. There is no change in the capacitance of the capacitor C1 from the first cycle to the second cycle of operation of the x kHz RF generator. As another example, the value PWARPCa is achieved without controlling the capacitor C2 to have the value C21a. A capacitance of the capacitor C2 is maintained to have the value C21 and the value PWARPCa is achieved based on the capacitance C21 instead of the capacitance C21a. There is no change in the capacitance of the capacitor C2 from the first cycle to the second cycle of operation of the x kHz RF generator. As yet another example, the value PWARPC1 is achieved without controlling the capacitor C1 to have the value C11. There is no change in the capacitance of the capacitor C1 leading to the first cycle of operation of the x kHz RF generator. As another example, the value PWARPC1 is achieved without controlling the capacitor C2 to have the value C21. There is no change in the capacitance of the capacitor C2 leading to the first cycle of operation of the x kHz RF generator.

In one embodiment, the cycle of operation of the x kHz RF generator is split into a number of subcycles other than five. For example, the cycle of operation of the x kHz RF generator is split into four cycles or six cycles. Capacitance values of the capacitors C1 and C2 are achieved for the other number of subcycles during the cycle of operation of the x kHz RF generator. Moreover, the z MHz RF generator has a frequency of operation during the other number of subcycles and the sensor measures values, such as four or six values, of the variable during the other number of subcycles.

Figures 4A, 4B:
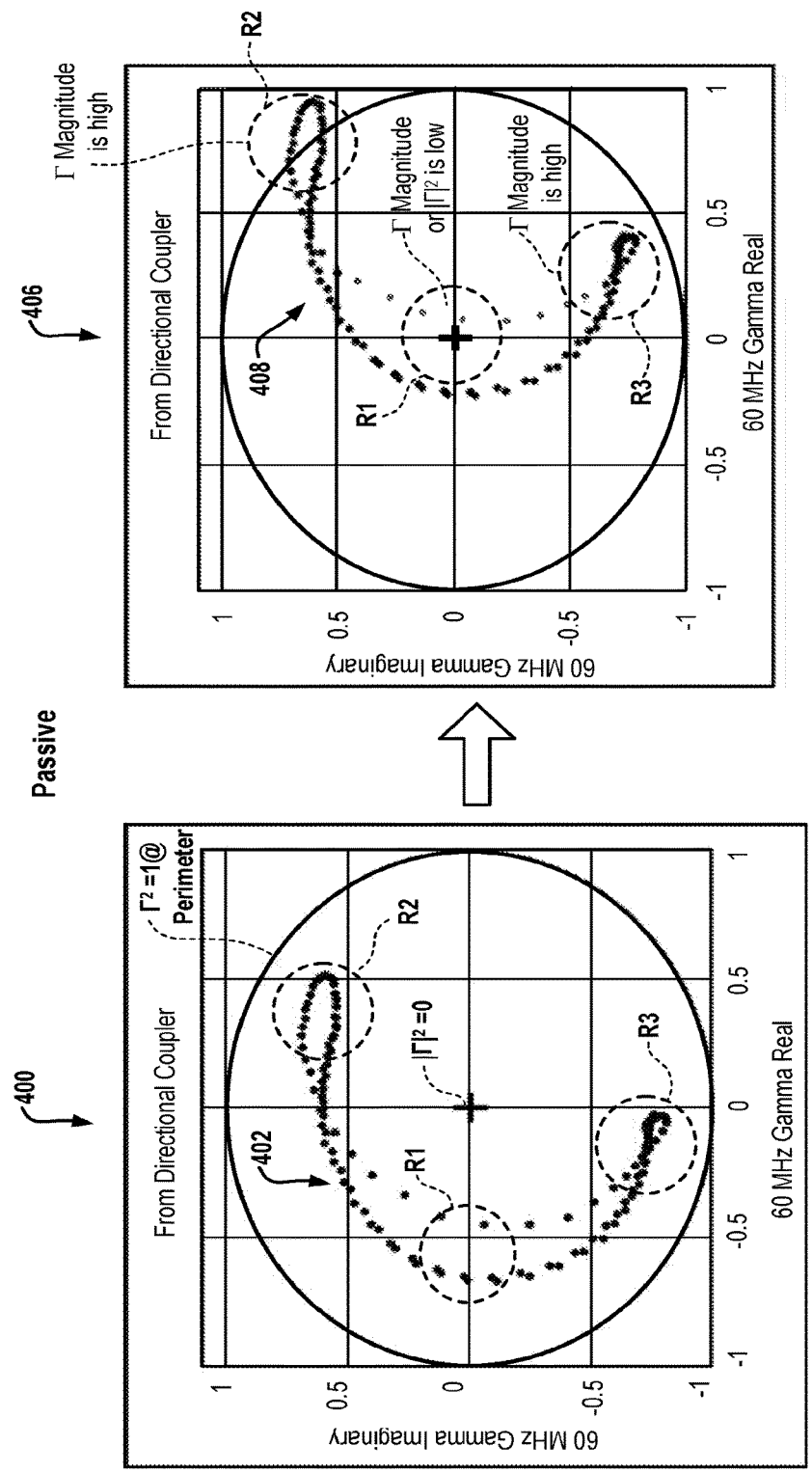
FIG. 4A is an embodiment of a Smith chart to illustrate that a power reflection coefficient is high when the methods described herein are not applied.
FIG. 4B is an embodiment of a Smith chart to illustrate that a power reflection coefficient is low to increase an efficiency in power delivered by the z MHz RF generator.

FIG. 4A is an embodiment of a Smith chart 400 to illustrate that the power reflection coefficient is high during the cycles of operation of the x kHz RF generator when the methods described herein to increase the efficiency of delivered power of the z MHz RF generator are not applied. The Smith chart 400 has a plot 402 of an imaginary portion of the voltage reflection coefficient at the output of the z MHz RF generator versus a real portion of the voltage reflection coefficient. The plot 402 covers a cycle of operation of the x kHz RF generator. For example, points of the plot 402 cover one cycle of operation of the x kHz RF generator. The Smith chart 400 is plotted for the cycle of the x kHz RF generator. In a region R1 of the Smith chart 400, none of the points of the plot 402 have the power reflection coefficient that is within a pre-determined limit from zero, such as within 25-30%, from zero. The power reflection coefficient is zero at a center of a Smith chart is zero and is one at a perimeter of the Smith chart. Moreover, some points of the plot 402 lie in a region R2 and a R3 of the Smith chart 400. The power reflection coefficient at the output of the z MHz RF generator during one cycle of the x kHz RF generator is high, such as within the regions R2 and R3, and is not low. For example, none of multiple points of the plot 402 have the power reflection coefficient that is within the pre-determined limit from zero.

The plot 402 is generated using the directional coupler that is coupled to the output of the z MHz generator. As an example, an average, over a cycle of 400 kHz, of a 60 MHz complex voltage reflection coefficient is approximately 0, such as zero, but an average, over a cycle of 400 kHz, of a 60 MHz power reflection coefficient $|\Gamma|^2$ is approximately 0.50, such as 50%. Hence, approximately 50% of the power supplied by the z MHz RF generator is wasted when the methods described herein are not applied.

FIG. 4B is an embodiment of a Smith chart 406 to illustrate that the power reflection coefficient is low to increase the efficiency in power delivered by the z MHz RF generator. The Smith chart 406 has a plot 408 of an imaginary portion of the voltage reflection coefficient at the output of the z MHz RF generator versus a real portion of the voltage reflection coefficient. The plot 408 covers a cycle of operation of the x kHz RF generator. The Smith chart 406 is plotted for a cycle of the x kHz RF generator. The plot 402 shifts to its right to generate the plot 408. In the plot 408, the region R1 is shifted to the right compared to the region R1 in the plot 402. For example, points within the region R1 are within the pre-determined limit from zero. To illustrate, for the points within the region R1, the power reflection coefficient at the output of the z MHz RF generator is within the pre-determined limit from zero.

In one embodiment, the power reflection coefficient at the output of the z MHz RF generator increases for points of the plot 408 within the regions R2 and R3 to increase the efficiency in power delivered by the z MHz RF generator. The power reflection coefficient at the output of the z MHz RF generator increases compared to the power reflection coefficient for the regions R2 and R3 of the plot 402.

FIG. 4C is an embodiment of a power contour 420 to illustrate that the power supplied by the z MHz RF generator at the output of the z MHz RF generator is low at a lower left corner of the power contour 420 and is high at an upper right corner of the power contour 420. The plot 408 is plotted within the power contour 420. There is an increase in power supplied by the z MHz RF generator at the output in addition to the decrease in the power reflection coefficient for some of the points of the plot 408, such as points within the regions R1 through R3, to increase the efficiency in power delivered by the z MHz RF generator. As such, there is a shift from left to right to generate the plot 408 in the power contour 420, and the power supplied by the z MHz RF generator increases. With a decrease in the power reflection coefficient at the output of the z MHz RF generator and an increase in the power supplied at the output of the z MHz RF generator, there is an increase in efficiency of power that is delivered by the z MHz RF generator. The increase in the efficiency power delivered by the z MHz RF generator increases efficiency in processing of a wafer.

Figure 5:
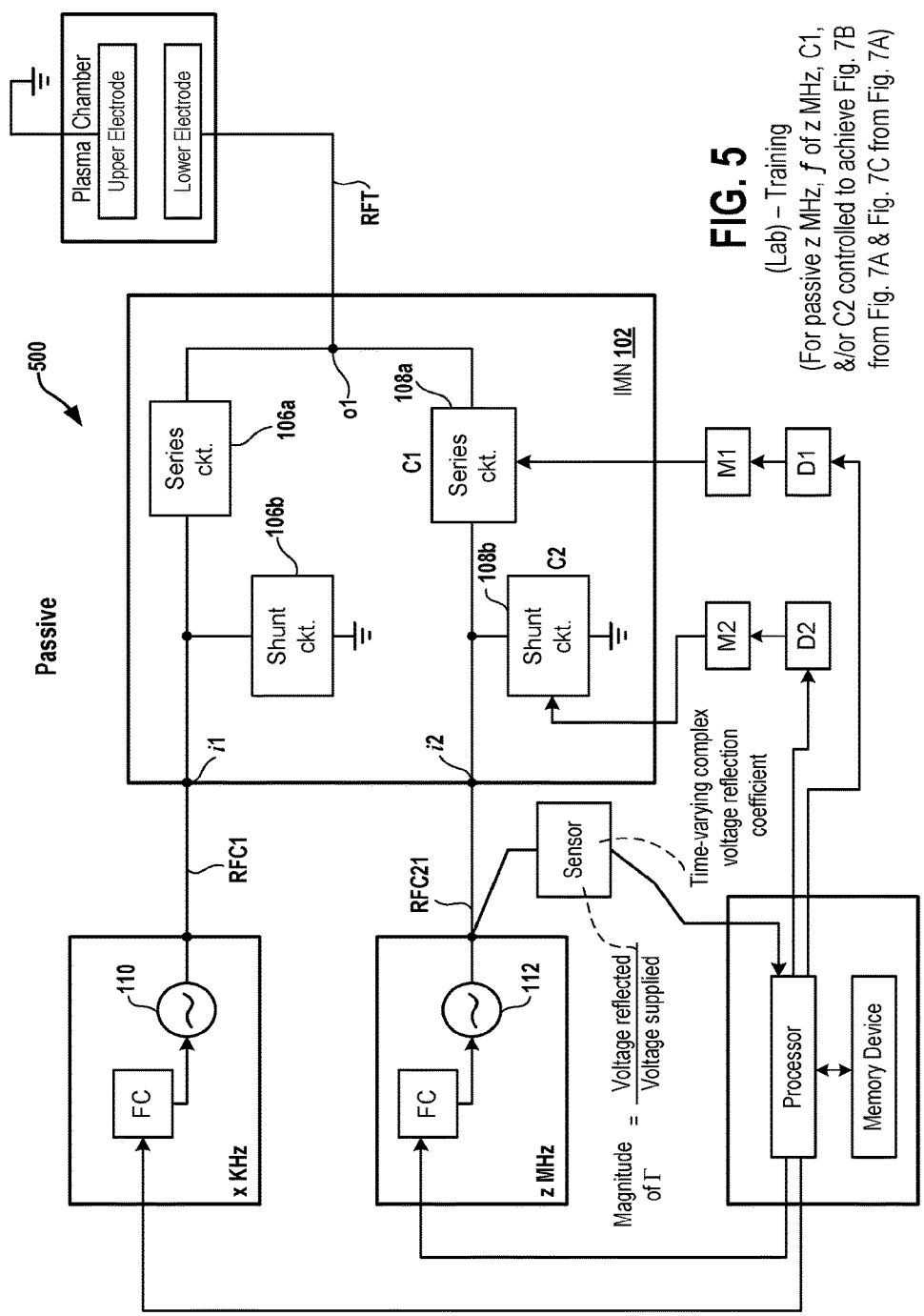
FIG. 5 is a diagram of an embodiment of a system to illustrate another training routine after an RF cable that couples an output of the z MHz RF generator to an input of an impedance matching network is changed.

FIG. 5 is a diagram of an embodiment of a system 500 to illustrate an effect of a change in the RF cable RFC2 that couples the output of the z MHz RF generator to the input i2 of the IMN 102 during a training routine. The system 500 is the same as the system 100 of FIG. 1 except that the RF cable RFC2 is replaced with another RF cable RFC21. For example, a length of the RF cable RFC2 is increased or decreased. As another example, a cross-sectional area of the RF cable RFC2 is increased or decreased. As yet another example, a length of the RF cable RFC2 is increased or decreased and a cross-sectional area of the RF cable RFC2 is increased or decreased. The RF cable RFC21 is coupled between the output of the z MHz RF generator and the input i2. The sensor measures the variable at the output of the z MHz RF generator. The variable is measured in the system 500 during a training routine in which there is no processing of the substrate. For example, the plasma chamber lacks the substrate for processing when the variable is measured by the sensor.

FIG. 6 is an embodiment of a table 600 to illustrate an operation of the system 500 of FIG. 5 during the training routine. As shown in the table 600, the x kHz RF generator operates with the first cycle that has the frequency of f11. When the x kHz RF generator operates at the frequency f11, the power supply 112 of the z MHz RF generator supplies power values ranging from Ps6 through Ps10. There is no control of the z MHz RF generator to provide the power values Ps6 through Ps10 during a cycle of operation of the x kHz RF generator. For example, there is no feedback loop to the processor of the host computer system to control the power values Ps6 through Ps10 within a cycle of operation of the x kHz RF generator. To further illustrate, during a cycle of operation of the x kHz RF generator, the processor does not change the power values Ps6 through Ps10 based on measured values of the variable that are received from the sensor that is coupled to the output of the z MHz RF generator.

The z MHz RF generator is operated at a frequency of f211 during the first cycle of the x kHz RF generator. For example, the processor of the host computer system provides the frequency f211 of operation of the z MHz RF generator to the FC of the z MHz RF generator. The FC of the z MHz RF generator provides the frequency f211 to the power supply 112 to operate the power supply 112 to generate an RF signal having the frequency f211 during the first cycle of operation of the x kHz RF generator.

The power supply 110 generates an RF signal having the frequency f11 and the power supply 112 generates another RF signal having the frequency f211 during the first cycle of operation of the x kHz RF generator. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f211 and having the power amounts PS6 through Ps10 is sent from the output of the z MHz RF generator via the RF cable RFC21 to the input i2 of the IMN 102. The IMN 102 matches an impedance of the load coupled to the output o1 with that of the source coupled to the inputs i1 and i2 and combines at the output of the RF signals received from the x kHz RF generator and the z MHz RF generator to generate a modified RF signal. The modified RF signal is sent from the output of via the RF transmission line RFT to the lower electrode.

Moreover, the capacitor C1 of the series circuit 108a is controlled to have a capacitance value C111 during the first cycle of operation of the x kHz RF generator. For example, the processor of the host computer system sends a command signal to the driver D1 to achieve a value of an area between plates of the capacitor C1. The driver D1 generates a drive signal based on the command signal and sends the drive signal to the motor M1. The rotor of the motor M1 rotates based on the drive signal to move the connection mechanism that is coupled to the motor M1 to further achieve the area between the plates of the capacitor C1. When the area between the plates of the capacitor C1 is achieved, the capacitor C1 has the capacitance C111.

Similarly, the capacitor C2 of the shunt circuit 108b is controlled to have a capacitance value C211 during the first cycle of operation of the x kHz RF generator. For example, the processor of the host computer system sends a command signal to the driver D2 to achieve a value of an area between plates of the capacitor C2. The driver D2 generates a drive signal based on the command signal and sends the drive signal to the motor M2. The rotor of the motor M2 rotates based on the drive signal to move the connection mechanism that is coupled to the motor M2 to further achieve the area between the plates of the capacitor C2. When the area between the plates of the capacitor C2 is achieved, the capacitor C2 has the capacitance C211.

When the frequency of operation of the x kHz RF generator is f11, the frequency of operation of the z MHz RF generator is f211, the power supplied by the z MHz RF generator is Ps6, the value of capacitance of the capacitor C1 is C111, and the value of capacitance of the capacitor C2 is C211, the sensor measures the voltage reflection coefficient to be Γ6 at the output of the z MHz RF generator. Similarly, when the frequency of operation of the x kHz RF generator is f11, the frequency of operation of the z MHz RF generator is f211, the power supplied by the z MHz RF generator is Ps7, the value of capacitance of the capacitor C1 is C111, and the value of capacitance of the capacitor C2 is C211, the sensor measures the voltage reflection coefficient to be Γ7 at the output of the z MHz RF generator. Furthermore, when the frequency of operation of the x kHz RF generator is f11, the frequency of operation of the z MHz RF generator is f211, the power supplied by the z MHz RF generator is Ps8, the value of capacitance of the capacitor C1 is C111, and the value of capacitance of the capacitor C2 is C211, the sensor measures the voltage reflection coefficient to be Γ8 at the output of the z MHz RF generator. Also, when the frequency of operation of the x kHz RF generator is f11, the frequency of operation of the z MHz RF generator is f211, the power supplied by the z MHz RF generator is Ps9, the value of capacitance of the capacitor C1 is C111, and the value of capacitance of the capacitor C2 is C211, the sensor measures the voltage reflection coefficient to be Γ9 at the output of the z MHz RF generator. When the frequency of operation of the x kHz RF generator is f11, the frequency of operation of the z MHz RF generator is f211, the power supplied by the z MHz RF generator is Ps10, the value of capacitance of the capacitor C1 is C111, and the value of capacitance of the capacitor C2 is C211, the sensor measures the voltage reflection coefficient to be Γ10 at the output of the z MHz RF generator.

The sensor also measures the power values Ps6 through Ps10 at the output of the z MHz RF generator. The sensor provides the values Γ6 through Γ10 and the values Ps6 through Ps10 to the processor via the transfer cable to the processor. The processor stores the value f11, the values Ps6 through Ps10, the value f211, the value C111, the value C211, and the values Γ6 through Γ10 in the table 600, which is stored in the memory device. In one embodiment, the processor stores the value f11, the values Ps6 through Ps10, the value f211, the value C111, the value C211, and the values Γ6 through Γ10 in a table 810 of FIG. 8B and stores the table 810 in the memory device.

The processor calculates a power-weighted average power reflection coefficient value PWAPRC2 for the first cycle of the x kHz RF generator. For example, the processor calculates the value PWARPC2 for the cycle of the x kHz RF generator to be $[\{(Ps6)\times(|\Gamma 6|)^2\}+\{(Ps7)\times(|\Gamma 7|)^2\}+\{(Ps8)\times(|\Gamma 8|)^2\}+\{(Ps9)\times(|\Gamma 9|)^2\}+\{(Ps10)\times(||\Gamma 10|)^2\}]/5$.

Similarly, the processor calculates another power-weighted average power reflection coefficient PWARPCA for the second cycle of operation of the x kHz RF generator. For example, the processor calculates the PWARPCA to be $[\{(Ps6A)\times(|\Gamma 6A|)^2\}+\{(Ps7A)\times(|\Gamma 7A|)^2\}+\{(Ps8A)\times(|\Gamma 8A-|)^2\}+\{(Ps9A)\times(|\Gamma 9A|)^2\}+\{(Ps10A)\times(|\Gamma 10A|)^2\}]/5$. It should be noted that when the frequency of operation of the x kHz RF generator is f11, the frequency of operation of the z MHz RF generator is f211A, the power supplied by the z MHz RF generator is Ps6A, the value of capacitance of the capacitor C1 is C111A, and the value of capacitance of the capacitor C2 is C211A, the sensor measures the voltage reflection coefficient to be Γ6A at the output of the z MHz RF generator. Similarly, when the frequency of operation of the x kHz RF generator is f11, the frequency of operation of the z MHz RF generator is f211A, the power supplied by the z MHz RF generator is Ps7A, the value of capacitance of the capacitor C1 is C111A, and the value of capacitance of the capacitor C2 is C211A, the sensor measures the voltage reflection coefficient to be Γ7A at the output of the z MHz RF generator. Furthermore, when the frequency of operation of the x kHz RF generator is f11, the frequency of operation of the z MHz RF generator is f211A, the power supplied by the z MHz RF generator is Ps8A, the value of capacitance of the capacitor C1 is C111A, and the value of capacitance of the capacitor C2 is C211A, the sensor measures the voltage reflection coefficient to be Γ8A at the output of the z MHz RF generator. Also, when the frequency of operation of the x kHz RF generator is f11, the frequency of operation of the z MHz RF generator is f211A, the power supplied by the z MHz RF generator is Ps9A, the value of capacitance of the capacitor C1 is C111A, and the value of capacitance of the capacitor C2 is C211A, the sensor measures the voltage reflection coefficient to be Γ9A at the output of the z MHz RF generator. When the frequency of operation of the x kHz RF generator is f11, the frequency of operation of the z MHz RF generator is f211A, the power supplied by the z MHz RF generator is Ps10A, the value of capacitance of the capacitor C1 is C111A, and the value of capacitance of the capacitor C2 is C211A, the sensor measures the voltage reflection coefficient to be Γ10A at the output of the z MHz RF generator.

During the second cycle of operation of the x kHz RF generator, the power supply 110 generates an RF signal having the frequency f11 and the power supply 112 generates another RF signal having the frequency f211A and having the power amounts Ps6A through Ps10A. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f211A and having the power amounts Ps6A through Ps10A is sent from the output of the z MHz RF generator via the RF cable RFC21 to the input i2 of the IMN 102. The IMN 102 matches an impedance of the load coupled to the output o1 with that of a source coupled to the inputs i1 and i2 and combines at the output of the RF signals received from the x kHz RF generator and the z MHz RF generator to generate a modified RF signal. The modified RF signal is sent from the output o1 via the RF transmission line RFT to the lower electrode.

For the RF cable RFC21, over multiple cycles of operation of the x kHz RF generator, the processor determines a value of the frequency of operation of the z MHz RF generator, a capacitance of the capacitor C1, and a capacitance of the capacitor C2 to increase the efficiency in power delivered by the z MHz RF generator. For example, the processor determines which one of the values PWARPC2 and PWARPCA is low. The processor compares the value PWARPC2 with the value PWARPCA to determine that the value PWARPC2 is lower than the value PWARPCA. The efficiency in power delivered by the z MHz RF generator increases during the first cycle for which the value PWARPC2 is computed. The processor identifies from the table 600 the value f211 of the frequency of operation of the z MHz RF generator during the first cycle, the capacitance C111 of the capacitor C1, and the capacitance C211 of the capacitor C2 for which the efficiency in power delivered by the z MHz RF generator increases. It should be noted that the efficiency in power delivered by the z MHz RF generator increases when the RF cable RFC21 is used to connect the output of the z MHz RF generator with the input i2 of the IMN 102.

In an embodiment, instead of controlling both the capacitors C1 and C2 to determine capacitances of the capacitors C1 and C2 for which the efficiency in power delivered by the z MHz RF generator increases, either the capacitor C1 or the capacitor C2 is controlled to determine a capacitance of the capacitor for which the efficiency increases. For example, the value PWARPCA is achieved without controlling the capacitor C1 to have the value C111A. A capacitance of the capacitor C1 is maintained to have the value C111 and the value PWARPCA is achieved based on the capacitance C111 instead of the value C111A. There is no change in the capacitance of the capacitor C1 from the first cycle to the second cycle of operation of the x kHz RF generator. As another example, the value PWARPCA is achieved without controlling the capacitor C2 to have the value C211A. A capacitance of the capacitor C2 is maintained to have the value C211 and the value PWARPCA is achieved based on the capacitance C211 instead of the value C211A. There is no change in the capacitance of the capacitor C2 from the first cycle to the second cycle of operation of the x kHz RF generator. As yet another example, the value PWARPC2 is achieved without controlling the capacitor C1 to have the value C111. There is no change in the capacitance of the capacitor C1 leading to the first cycle of operation of the x kHz RF generator. As another example, the value PWARPC2 is achieved without controlling the capacitor C2 to have the value C211. There is no change in the capacitance of the capacitor C2 leading to the first cycle of operation of the x kHz RF generator.

FIG. 7A is an embodiment of the Smith chart 406. The Smith chart 406 includes the plot 408. FIG. 7B is an embodiment of a Smith chart 702 to illustrate that the power reflection coefficient is low within the region R1 when the efficiency in power delivered by the z MHz RF generator increases. The Smith chart 702 has a plot 704 of an imaginary portion of the voltage reflection coefficient at the output of the z MHz RF generator versus a real portion of the voltage reflection coefficient. The plot 704 covers a cycle of operation of the x kHz RF generator. The plot 704 is plotted for a cycle of the x kHz RF generator. The plot 408 rotates in a clockwise direction and changes in shape to generate the plot 704 to increase the efficiency in power delivered by the z MHz RF generator. In the plot 704, the region R1 is rotated clockwise compared to the region R1 in the plot 408. After the rotation to the right, the plot 704 has the same number of points or an increased number of points that fall in the region R1 compared to the plot 406.

FIG. 7C is an embodiment of a power contour 720 to illustrate that the power supplied by the z MHz RF generator at the output of the z MHz RF generator is higher for the RF cable RFC21 of FIG. 5 compared to the RF cable RFC2 of FIG. 1 for a portion of the first cycle of the x kHz RF generator. As illustrated in the plot 704 plotted within the power contour 720, a larger number of points fall within the region R1 compared to the plot 408 of FIG. 7A. As such, an amount of the power supplied at the output of the z MHz RF generator for the points in the region R1 of the plot 704 is greater than an amount of points that fall in the region R1 of the plot 408. There is an increase in power supplied by the z MHz RF generator at the output in addition to the decrease in the power reflection coefficient for some of the points of the plot 704. The amount of power at the output of the z MHz RF generator increases compared to the amount of power at the output when the RF cable RFC2 is used. As there is a rotation in the clockwise direction in the plot 704, the power supplied by the z MHz RF generator increases for the region R1.

As shown in FIG. 7C, the region R1 near a center of the Smith chart 702, where the power reflection coefficient $|\Gamma|^2$ is less, has the highest output power by being closest to the top right corner of the power contour 720. Moreover, as shown in FIG. 7C, the regions R2 and R3 have the highest power reflection coefficient $|\Gamma|^2$ by being located near a perimeter of the Smith chart 702 and has lowest power supplied by the z MHz RF generator by being located toward a lower left corner of the power contour 720.

In one embodiment, as shown in the plot 704, power supplied at the output of the z MHz RF generator decreases in the region R2 for the RF cable RFC21 compared to the RF cable RFC2. The power supplied at the output of the z MHz RF generator decreases compared to an amount of the power shown in the region R2 of the plot 408. In an embodiment, as shown in the plot 704, power supplied at the output of the z MHz RF generator is substantially the same in the region R3 for the RF cable RFC21 compared to the RF cable RFC2. The power supplied at the output of the z MHz RF generator is substantially the same compared to an amount of the power shown in the region R3 of the plot 408.

Figure 8A:
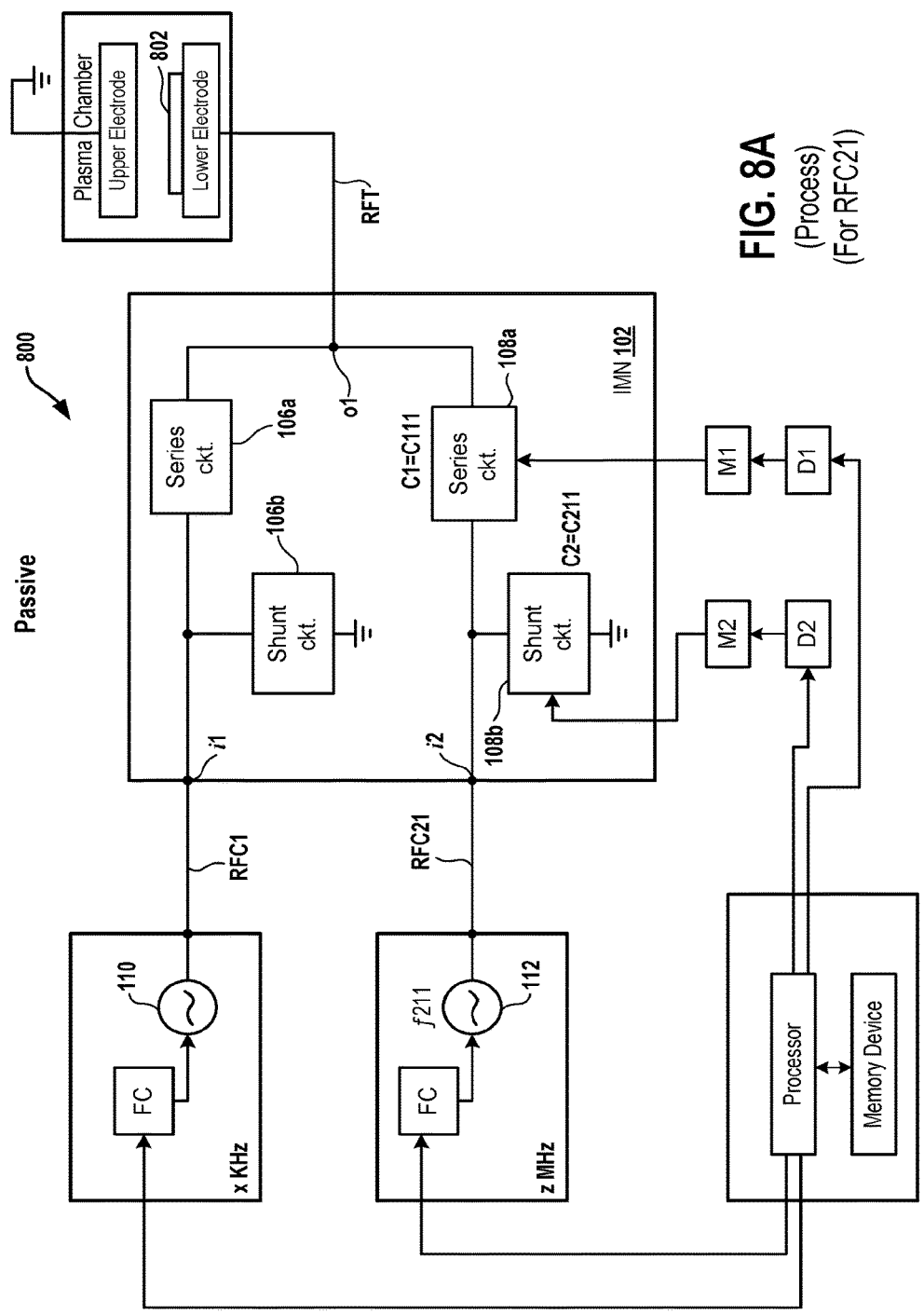
FIG. 8A is a diagram of an embodiment of a system for illustrating a processing routine in which a frequency of the z MHz RF generator, a capacitance of a series circuit of the impedance matching network, and another capacitance of a shunt circuit of the impedance matching network are used when the changed RF cable is used.

FIG. 8A is a diagram of an embodiment of a system 800 for illustrating a processing routine in which the frequency f211, the capacitance C111, and the capacitance C211 are used. When the frequency f211, the capacitance C111, and the capacitance C211 are used, there is an increase in efficiency in power delivered by the z MHz RF generator. The system 800 is the same as the system 500 of FIG. 5 except that in the system 800, the substrate, such as a wafer 802, is being processed. For example, the substrate is being deposited with materials, or is being cleaned, or is being etched, or is being sputtered. The substrate is processed by being placed on a surface of the lower electrode. Moreover, the system 800 excludes the sensor. The training routine illustrated with reference to FIGS. 5 and 6 is executed before the processing routine illustrated in the system 800 of FIG. 8A is executed.

FIG. 8B is an embodiment of the table 810 to illustrate the processing routine of the system 800 of FIG. 8A. As shown in the table 810, the x kHz RF generator operates repetitively with a cycle that has the frequency f11. Each cycle of operation of the x kHz RF generator has the frequency f11. During the processing routine, the processor of the host computer system provides the frequency f11 of operation of the x kHz RF generator to the FC of the x kHz RF generator. The FC provides the frequency f11 to the power supply 110 and the power supply 110 generates an RF signal having the frequency f11 during the cycle of operation of the x kHz RF generator.

When the x kHz RF generator operates at the frequency f11, the power supply 112 of the z MHz RF generator supplies power values, such as the power values ranging from Ps6 through Ps10. There is no control of the z MHz RF generator to provide the power values Ps6 through Ps10 during a cycle of operation of the x kHz RF generator. For example, the sensor is not coupled to the output of the z MHz RF generator to create the feedback loop to control the power values Ps6 through Ps10 during a cycle of operation of the x kHz RF generator.

The processor identifies from the table 810 the value f211 of the frequency of operation of the z MHz RF generator, the capacitance C111 of the capacitor C1, and the capacitance C211 of the capacitor C2 for which the efficiency in power delivered by the z MHz RF generator is increased. The z MHz RF generator is controlled by the processor to be operated at the frequency of f211 during the multiple cycles of operation of the x kHz RF generator. For example, the processor of the host computer system provides the frequency f211 of operation of the z MHz RF generator to the FC of the z MHz RF generator. The FC of the z MHz RF generator provides the frequency f211 to the power supply 112 to operate the power supply 112 to generate an RF signal having the frequency f211 during the cycles of operation of the x kHz RF generator.

Moreover, the capacitor C1 of the series circuit 108a is controlled by the processor to have the capacitance value C111 during the cycles of operation of the x kHz RF generator in the same manner as that described above with reference to FIG. 6. Similarly, the capacitor C2 of the shunt circuit 108b is controlled by the processor to have the capacitance value C211 during the cycles of operation of the x kHz RF generator in the same manner as that described above with reference to FIG. 6.

During the processing routine and the cycles of operation of the x kHz RF generator, the power supply 110 generates an RF signal having the frequency f11 and the power supply 112 generates another RF signal having the frequency f211 and the power values Ps6 through Ps10. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f211 and having the power amounts Ps6 through Ps10 is sent from the output of the z MHz RF generator via the RF cable RFC21 to the input i2 of the IMN 102. The IMN 102 matches an impedance of the load coupled to the output o1 with that of the source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode.

During the processing routine, in addition to supplying the modified RF signal to the lower electrode, one or more process gases, e.g., oxygen containing gas, fluorine containing gas, etc., are supplied via the upper electrode to the gap between the lower electrode and the upper electrode of the plasma chamber. Upon reception of the modified RF signal and the one or more process gases, plasma is generated or is maintained within the gap to process the wafer 802. When the frequency f211, the capacitance C111, and the capacitance C211 are maintained over the multiple cycles of operation of the x kHz RF generator, there is an increase in efficiency in power delivered by the z MHz RF generator during the processing routine The balance improves efficiency of power delivered by the z MHz RF generator by reducing power that is reflected towards the z MHz RF generator. The increase in the efficiency of power delivered by the z MHz RF generator increases efficiency of processing the wafer 802.

In an embodiment, during the processing routine having the multiple cycles of operation of the x kHz RF generator, instead of controlling both the capacitors C1 and C2 to achieve the capacitance C111 and the capacitance C211 for which there is an increase in efficiency in power delivered by the z MHz RF generator, either the capacitor C1 or the capacitor C2 is controlled to increase the efficiency. For example, the processor does not control the capacitor C1 via the motor M1 so that the capacitor C1 has the capacitance C111. Rather, the processor controls the capacitor C2 via the motor M2 so that the capacitor C2 has the capacitance C211. As another example, the processor does not control the capacitor C2 via the motor M2 so that the capacitor C2 has the capacitance C211. Rather, the processor controls the capacitor C1 via the motor M1 so that the capacitor C1 has the capacitance C111.

In one embodiment, during the processing routine, each cycle of operation of the x kHz RF generator is split into a number of subcycles other than five.

Figure 9A:
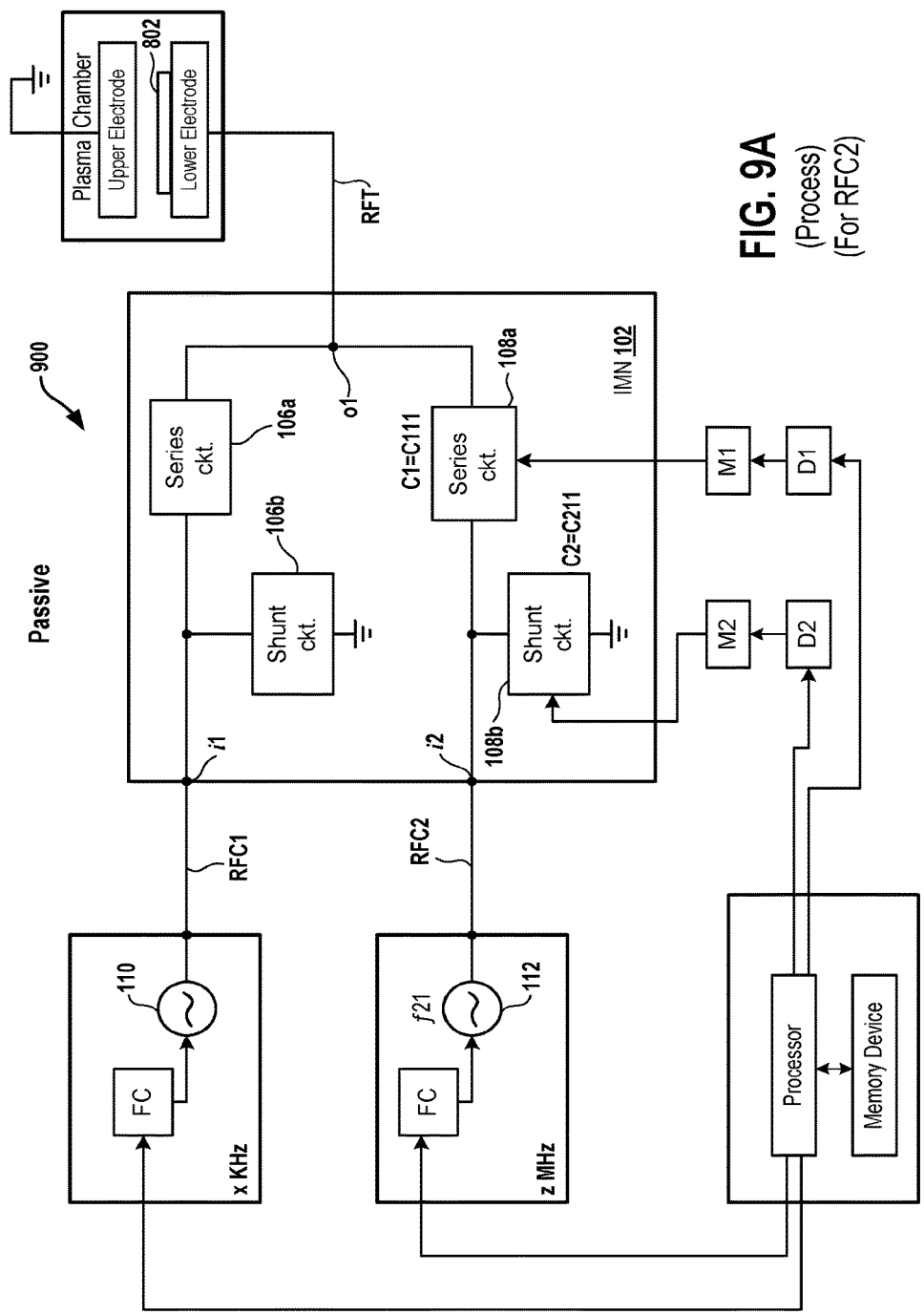
FIG. 9A is a diagram of an embodiment of a system for illustrating a processing routine in which a frequency of the z MHz RF generator, a capacitance of a series circuit of the impedance matching network, and another capacitance of a shunt circuit of the impedance matching network are used when the RF cable of the system of FIG. 1 is used.

FIG. 9A is a diagram of an embodiment of a system 900 for illustrating a processing routine in which the frequency f21, the capacitance C11, and the capacitance C21 are used. When the frequency f21, the capacitance C11, and the capacitance C21 are used, there is an increase in efficiency in power delivered by the z MHz RF generator. The system 900 is the same as the system 100 of FIG. 1 except that in the system 900, the wafer 802 is being processed. Moreover, the system 900 excludes the sensor. The training routine illustrated with reference to FIGS. 1 and 3 is executed before the processing routine illustrated in the system 900 of FIG. 9A.

FIG. 9B is an embodiment of the table 910 to illustrate the processing routine of the system 900 of FIG. 9A for the RF cable RFC2. As shown in the table 910, the x kHz RF generator operates repetitively with a cycle that has the frequency f11. Each cycle of operation of the x kHz RF generator has the frequency f11. During the processing routine, the processor of the host computer system provides the frequency f11 of operation of the x kHz RF generator to the FC of the x kHz RF generator. The FC provides the frequency f11 to the power supply 110 and the power supply 110 generates an RF signal having the frequency f11 during the cycles of operation of the x kHz RF generator.

During the processing routine, when the x kHz RF generator operates at the frequency f11, the power supply 112 of the z MHz RF generator supplies power values, such as the power values ranging from Ps1 through Ps5. There is no control of the z MHz RF generator to provide the power values Ps1 through Ps5 during a cycle of operation of the x kHz RF generator. For example, the sensor is not coupled to the output of the z MHz RF generator to create the feedback loop to control the power values Ps1 through Ps5 during a cycle of operation of the x kHz RF generator.

The processor identifies from the table 910 the value f21 of the frequency of operation of the z MHz RF generator, the capacitance C11 of the capacitor C1, and the capacitance C21 of the capacitor C2 for which there is an increase in efficiency in power delivered by the z MHz RF generator. The z MHz RF generator is controlled by the processor to be operated at the frequency of f21 during the multiple cycles of the x kHz RF generator. For example, the processor of the host computer system provides the frequency f21 of operation of the z MHz RF generator to the FC of the z MHz RF generator. The FC of the z MHz RF generator provides the frequency f21 to the power supply 112 to operate the power supply 112 to generate an RF signal having the frequency f21 during the cycles of operation of the x kHz RF generator.

Moreover, as described above with reference to FIG. 3, the capacitor C1 of the series circuit 108a is controlled by the processor to have the capacitance value C11 during the cycles of operation of the x kHz RF generator. Similarly, as described above with reference to FIG. 3, the capacitor C2 of the shunt circuit 108b is controlled by the processor to have the capacitance value C21 during the cycles of operation of the x kHz RF generator.

The power supply 110 generates an RF signal having the frequency f11 and the power supply 112 generates another RF signal having the frequency f21 and the power values Ps1 through Ps5 during the cycles of operation of the processing routine of the x kHz RF generator. The RF signal generated by the power supply 110 and having the frequency f11 is sent from the output of the x kHz RF generator via the RF cable RFC1 to the input i1 of the IMN 102. Similarly, the RF signal, generated by the power supply 112, having the frequency f21 and having the power amounts Ps1 through Ps5 is sent from the output of the z MHz RF generator via the RF cable RFC2 to the input i2 of the IMN 102. The IMN 102 matches an impedance of the load coupled to the output o1 with that of the source coupled to the inputs i1 and i2 and combines at the output of the RF signals received from the x kHz RF generator and the z MHz RF generator to generate a modified RF signal. The modified RF signal is sent from the output o1 via the RF transmission line RFT to the lower electrode.

In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802. When the frequency f21, the capacitance C11, and the capacitance C21 are maintained over the multiple cycles of operation of the x kHz RF generator, there is an increase in efficiency in power delivered by the z MHz RF generator during the processing routine.

In an embodiment, during the processing routine having the multiple cycles of operation of the x kHz RF generator, instead of controlling both the capacitors C1 and C2 to achieve the capacitance C11 and the capacitance C21 for which there is an increase in efficiency in power delivered by the z MHz RF generator, either the capacitor C1 or the capacitor C2 is controlled to increase the efficiency in a manner described above with reference to FIG. 8B.

In one embodiment, during the processing routine, each cycle of operation of the x kHz RF generator is split into a number of subcycles other than five in a manner described above with reference to FIG. 8B.

In an embodiment, the methods described above with reference to FIGS. 3 and 6 are performed during processing of the substrate 802 instead of during a training routine. For example, while the methods described above with reference to FIGS. 1, 2, 5, and 6 are being performed, the substrate 802 is being processed.

FIG. 10 is a diagram of an embodiment of a system 1000 for illustrating an active control of the z MHz RF generator during multiple cycles of operation of the x kHz RF generator. The system 1000 is the same as the system 100 of FIG. 1 except that in the system 1000, a power controller (PWR CTRL) of the z MHz RF generator actively controls an amount of power supplied by the power supply 112 during a cycle of operation of the x kHz RF generator. For example, the power controller of the z MHz RF generator changes, such as increases or decreases, the amount of power supplied by the power supply 112 from the first cycle of operation of the x kHz RF generator to the second cycle of operation of the x kHz RF generator. The power controller of the z MHz RF generator is coupled to the power supply 112. Moreover, the system 1000 is the same as the system 100 of FIG. 1 except that in the system 1000, the substrate 802 is being processed while a table 1100 (FIG. 11) is being generated.

FIG. 11 is an embodiment of the table 1100 to illustrate an operation of the system 1000 of FIG. 10. As shown in the table 1100, the x kHz RF generator has the first cycle having the frequency f11 of operation.

Each cycle of operation of the x kHz RF generator has the frequency f11. For example, a first one-fifth of the first cycle of operation of the x kHz RF generator has the frequency f11, a second one-fifth of the first cycle of operation of the x kHz RF generator has the frequency f11, a third one-fifth of the first cycle of operation of the x kHz RF generator has the frequency f11, a fourth one-fifth of the first cycle of operation of the x kHz RF generator has the frequency f11, and a fifth one-fifth of the first cycle of operation of the x kHz RF generator has the frequency f11. The second one-fifth of the first cycle is consecutive to the first one-fifth of the first cycle. The third one-fifth of the first cycle is consecutive to the second one-fifth of the first cycle. The fourth one-fifth of the first cycle is consecutive to the third one-fifth of the first cycle. The fifth one-fifth of the first cycle is consecutive to the fourth one-fifth of the first cycle. The processor of the host computer system provides the frequency f11 of operation of the x kHz RF generator to the FC of the x kHz RF generator. The FC provides the frequency f11 to the power supply 110 and the power supply 110 generates an RF signal having the frequency f11 during the first cycle of operation of the x kHz RF generator.

When the x kHz RF generator operates at the frequency f11 during the first one-fifth subcycle of the first cycle of operation of the x kHz RF generator, the power supply 112 of the z MHz RF generator is controlled to supply a power value of Ps11. For example, the processor of the host computer system provides the power value Ps11 of operation of the z MHz RF generator to the power controller of the z MHz RF generator. The power controller of the z MHz RF generator provides the power value Ps11 to the power supply 112 to operate the power supply 112 to generate an RF signal having the power value Ps11 during the first one-fifth subcycle of the first cycle of operation of the x kHz RF generator. Similarly, when the x kHz RF generator operates at the frequency f11 during the second one-fifth subcycle of the first cycle of operation of the x kHz RF generator, the power supply 112 of the z MHz RF generator is controlled to supply a power value of Ps12. Moreover, when the x kHz RF generator operates at the frequency f11 during the third one-fifth subcycle of the first cycle of operation of the x kHz RF generator, the power supply 112 of the z MHz RF generator is controlled to supply a power value of Ps13. When the x kHz RF generator operates at the frequency f11 during the fourth one-fifth subcycle of the first cycle of operation of the x kHz RF generator, the power supply 112 of the z MHz RF generator is controlled to supply a power value of Ps14. Also, when the x kHz RF generator operates at the frequency f11 during the fifth one-fifth subcycle of the first cycle of operation of the x kHz RF generator, the power supply 112 of the z MHz RF generator is controlled to supply a power value of Ps15.

The control of the power controller of the z MHz RF generator by the processor to maintain the power values Ps11 through Ps15 during the first cycle of operation of the x kHz RF generator is an active control of the z MHz RF generator. For example, there is a feedback loop from the sensor to the processor of the host computer system to control the power value of the z MHz RF generator. To further illustrate, during the first one-fifth subcycle of the first cycle of operation of the x kHz RF generator, the processor changes a power value of the z MHz RF generator to achieve the power value Ps11 based on measured values of the variable that are received from the sensor that is coupled to the output of the z MHz RF generator.

The z MHz RF generator is operated at the frequency of f21 during the first cycle of operation of the x kHz RF generator. For example, the processor of the host computer system provides the frequency f21 of operation of the z MHz RF generator to the FC of the z MHz RF generator during the first through fifth subcycles of the first cycle of operation of the x kHz RF generator. The FC of the z MHz RF generator provides the frequency f21 to the power supply 112 to operate the power supply 112 to generate an RF signal having the frequency f21 during the first through fifth subcycles of the first cycle of operation of the x kHz RF generator.

The power supply 110 generates an RF signal having the frequency f11 and the power supply 112 generates another RF signal having the frequency f21 and the power values Ps11 through Ps15 during the first cycle of operation of the x kHz RF generator. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f21 and having the power amounts Ps11 through Ps15 is sent from the output of the z MHz RF generator via the RF cable RFC2 to the input i2 of the IMN 102. The RF signal has the power amount Ps11 during the first one-fifth subcycle of the first cycle of the x kHz RF generator, the power amount Ps12 during the second one-fifth subcycle of the first cycle of the x kHz RF generator, the power amount Ps13 during the third one-fifth subcycle of the first cycle of the x kHz RF generator, the power amount Ps14 during the fourth one-fifth subcycle of the first cycle of the x kHz RF generator, and the power amount Ps15 during the fifth one-fifth subcycle of the first cycle of the x kHz RF generator.

The IMN 102 matches an impedance of the load coupled to the output o1 with that of the source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode. In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802.

Moreover, the capacitor C1 of the series circuit 108a is controlled to have the capacitance value C11 during the first cycle of operation of the x kHz RF generator in the same manner as that described above in which the capacitor C1 of the series circuit 108a is controlled to have the capacitance value C11 during the cycle of operation of the x kHz RF generator. Similarly, the capacitor C2 of the shunt circuit 108b is controlled to have the capacitance value C21 during the first cycle of operation of the x kHz RF generator in the same manner as that described above in which the capacitor C2 of the shunt circuit 108b is controlled to have the capacitance value C21 during the first cycle of operation of the x kHz RF generator.

During the first one-fifth subcycle of the first cycle in which the frequency of operation of the x kHz RF generator is f11, the frequency of operation of the z MHz RF generator is f21, the power supplied by the z MHz RF generator is Ps11, the value of capacitance of the capacitor C1 is C11, and the value of capacitance of the capacitor C2 is C21, the sensor measures the voltage reflection coefficient to be Γ1 at the output of the z MHz RF generator. Similarly, during the second one-fifth subcycle of the first cycle in which the frequency of operation of the x kHz RF generator is f11, the frequency of operation of the z MHz RF generator is f21, the power supplied by the z MHz RF generator is Ps12, the value of capacitance of the capacitor C1 is C11, and the value of capacitance of the capacitor C2 is C21, the sensor measures the voltage reflection coefficient to be Γ2 at the output of the z MHz RF generator. Furthermore, during the third one-fifth subcycle of the first cycle in which the frequency of operation of the x kHz RF generator is f11, the frequency of operation of the z MHz RF generator is f21, the power supplied by the z MHz RF generator is Ps13, the value of capacitance of the capacitor C1 is C11, and the value of capacitance of the capacitor C2 is C21, the sensor measures the voltage reflection coefficient to be Γ3 at the output of the z MHz RF generator. Also, during the fourth one-fifth subcycle of the first cycle in which the frequency of operation of the x kHz RF generator is f11, the frequency of operation of the z MHz RF generator is f21, the power supplied by the z MHz RF generator is Ps14, the value of capacitance of the capacitor C1 is C11, and the value of capacitance of the capacitor C2 is C21, the sensor measures the voltage reflection coefficient to be Γ4 at the output of the z MHz RF generator. During the fifth one-fifth subcycle of the first cycle in which the frequency of operation of the x kHz RF generator is f11, the frequency of operation of the z MHz RF generator is f21, the power supplied by the z MHz RF generator is Ps15, the value of capacitance of the capacitor C1 is C11, and the value of capacitance of the capacitor C2 is C21, the sensor measures the voltage reflection coefficient to be ΓS at the output of the z MHz RF generator.

The sensor also measures the power values Ps11 through Ps15 at the output of the z MHz RF generator. The sensor provides the values Γ1 through ΓS and the values Ps11 through Ps15 to the processor via the transfer cable. The processor stores the value f11, the power values Ps11 through Ps15, the frequency value f21, the value C11, the value C21, and the values Γ1 through ΓS in the table 1100, which is stored in the memory device. In one embodiment, the processor stores the value f11, the power values Ps11 through Ps15, the frequency value f21, the value C11, the value C21, and the values Γ1 through ΓS in a table 1500 (FIG. 15). The table 1500 is stored in the memory device.

The processor calculates the PWAPRC for the first cycle of operation of the x kHz RF generator. For example, the processor calculates a PWARPC3 for the first cycle of the x kHz RF generator to be $[\{(Ps11)\times(|\Gamma 1|)^2\}+\{(Ps12)\times(|\Gamma 2|)^2\}+\{(Ps13)\times(|\Gamma 3|)^2\}+\{(Ps14)\times(|\Gamma 4|)^2\}+\{(Ps15)\times(|\Gamma 5|)^2\}]/5$.

Similarly, the processor calculates another power-weighted average power reflection coefficient value PWARPCb for the second cycle of operation of the x kHz RF generator. For example, the processor calculates the PWARPCb to be $[\{(Ps11b)\times(|\Gamma 1b|)^2\}+\{(Ps12b)\times(|\Gamma 2b|)^2\}+\{(Ps13b)\times(|\Gamma 3b|)^2\}+\{(Ps14b)\times(|\Gamma 4b|)^2\}+\{(Ps15b)\times(|\Gamma 5b|)^2\}]/5$. Moreover, during a first one-fifth subcycle of the second cycle of operation of the x kHz RF generator in which the frequency of operation of the x kHz RF generator is f11, the frequency of operation of the z MHz RF generator is controlled to be f21b, the power supplied by the z MHz RF generator is controlled to be Ps11b, the value of capacitance of the capacitor C1 is C11b, and the value of capacitance of the capacitor C2 is C21b, the sensor measures the voltage reflection coefficient to be Γ1b at the output of the z MHz RF generator. Similarly, during a second one-fifth subcycle of the second cycle of operation of the x kHz RF generator in which the frequency of operation of the x kHz RF generator is f11, the frequency of operation of the z MHz RF generator is controlled to be f21b, the power supplied by the z MHz RF generator is controlled to be Ps12b, the value of capacitance of the capacitor C1 is C11b, and the value of capacitance of the capacitor C2 is C21b, the sensor measures the voltage reflection coefficient to be Γ2b at the output of the z MHz RF generator. Furthermore, during a third one-fifth subcycle of the second cycle of operation of the x kHz RF generator in which the frequency of operation of the x kHz RF generator is f11, the frequency of operation of the z MHz RF generator is controlled to be f21b, the power supplied by the z MHz RF generator is controlled to be Ps13b, the value of capacitance of the capacitor C1 is C11b, and the value of capacitance of the capacitor C2 is C21b, the sensor measures the voltage reflection coefficient to be Γ3b at the output of the z MHz RF generator. Also, during a fourth one-fifth subcycle of the second cycle of operation of the x kHz RF generator in which the frequency of operation of the x kHz RF generator is f11, the frequency of operation of the z MHz RF generator is controlled to be f21b, the power supplied by the z MHz RF generator is controlled to be Ps14b, the value of capacitance of the capacitor C1 is C11b, and the value of capacitance of the capacitor C2 is C21b, the sensor measures the voltage reflection coefficient to be Γ4b at the output of the z MHz RF generator. During a fifth one-fifth subcycle of the second cycle of operation of the x kHz RF generator in which the frequency of operation of the x kHz RF generator is f11, the frequency of operation of the z MHz RF generator is controlled to be f21b, the power supplied by the z MHz RF generator is controlled to be Ps15b, the value of capacitance of the capacitor C1 is C11b, and the value of capacitance of the capacitor C2 is C21b, the sensor measures the voltage reflection coefficient to be Γ5b at the output of the z MHz RF generator.

It should be noted that for active control, a frequency of the z MHz RF generator is controlled using the FC of the z MHz RF generator. For example, the processor of the host computer system provides the frequency f21b of operation of the z MHz RF generator to the FC of the z MHz RF generator. The FC of the z MHz RF generator provides the frequency f21b to the power supply 112 to operate the power supply 112 to generate an RF signal having the frequency f21b. Similarly, it should be noted that for active control, an amount of power supplied of the z MHz RF generator is controlled using the power controller of the z MHz RF generator. For example, during the first one-fifth subcycle of the second cycle of operation of the x kHz RF generator, the processor of the host computer system provides the amount of power Ps11b for operation of the z MHz RF generator to the power controller of the z MHz RF generator. The power controller of the z MHz RF generator provides the power amount Ps11b to the power supply 112 to operate the power supply 112 to generate an RF signal having the power amount Ps11b.

The power supply 110 generates an RF signal having the frequency f11 and the power supply 112 generates another RF signal having the frequency f21b and the power amounts Ps11b through Ps15b during the second cycle of operation of the x kHz RF generator. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f21b and having the power amounts Ps11b through Ps15b is sent from the output of the z MHz RF generator via the RF cable RFC2 to the input i2 of the IMN 102. The RF signal has the power amount Ps11b during the first one-fifth subcycle of the second cycle of the x kHz RF generator, the power amount Ps12b during the second one-fifth subcycle of the second cycle of the x kHz RF generator, the power amount Ps13b during the third one-fifth subcycle of the second cycle of the x kHz RF generator, the power amount Ps14b during the fourth one-fifth subcycle of the second cycle of the x kHz RF generator, and the power amount Ps15b during the fifth one-fifth subcycle of the second cycle of the x kHz RF generator.

The IMN 102 matches an impedance of the load coupled to the output o1 with that of the source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode. In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802.

Over multiple cycles of operation of the x kHz RF generator for the active control and the RF cable RFC2, the processor determines a value of the power to be supplied by the power supply 112 of the z MHz RF generator, a value of the frequency of operation of the z MHz RF generator, a capacitance of the capacitor C1, and a capacitance of the capacitor C2 for which there is an increase in efficiency in power delivered by the z MHz RF generator. For example, the processor determines which one of the values PWARPC3 and PWARPCb is low. The processor compares the value PWARPC3 with the value PWARPCb to determine that the value PWARPC3 is lower than the value PWARPCb. There is an increase in efficiency in power delivered by the z MHz RF generator during the first cycle for which the value PWARPC3 is computed. The processor identifies from the table 1100 the value f21 of the frequency of operation of the z MHz RF generator during the first cycle, the power values Ps11 through Ps15 of power supplied by the z MHz RF generator, the capacitance C11 of the capacitor C1, and the capacitance C21 of the capacitor C2 for which there is an increase in efficiency in power delivered by the z MHz RF generator. It should be noted that there is an increase in efficiency in power delivered by the z MHz RF generator when the RF cable RFC2 is used to connect the output of the z MHz RF generator to the input i2 of the IMN 102.

In an embodiment, instead of controlling both the capacitors C1 and C2 to determine capacitances of the capacitors C1 and C2 for which there is an increase in efficiency in power delivered by the z MHz RF generator, either the capacitor C1 or the capacitor C2 is controlled to increase the efficiency. For example, the value PWARPCb is achieved without controlling the capacitor C1 to have the value C11b. A capacitance of the capacitor C1 is maintained to have the value C11 and the value PWARPC3 is determined based on the capacitance C11 rather than the capacitance C11b. There is no change in the capacitance of the capacitor C1 from the first cycle to the second cycle of operation of the x kHz RF generator. As another example, the value PWARPCb is achieved without controlling the capacitor C2 to have the value C21b. A capacitance of the capacitor C2 is maintained to have the value C21 and the value PWARPCb is determined based on the capacitance C21 instead of the capacitance C21b. There is no change in the capacitance of the capacitor C2 from the first cycle to the second cycle of operation of the x kHz RF generator. As yet another example, the value PWARPC3 is achieved without controlling the capacitor C1 to have the value C11. There is no change in the capacitance of the capacitor C1 leading to the first cycle of operation of the x kHz RF generator. As another example, the value PWARPC3 is achieved without controlling the capacitor C2 to have the value C21. There is no change in the capacitance of the capacitor C2 leading to the first cycle of operation of the x kHz RF generator.

In one embodiment, a cycle of operation of the x kHz RF generator during the active control is split into a number of subcycles other than five during the active control for the RF cable RFC2. For example, the first cycle of operation of the x kHz RF generator is split into four subcycles or six subcycles. Capacitance values of the capacitors C1 and C2 are achieved for the other number of subcycles during the cycle of operation of the x kHz RF generator. Moreover, the z MHz RF generator has a frequency of operation during the other number of subcycles and the sensor measures values, such as four or six values, of the variable during the other number of subcycles.

It should be noted that a power value of supplied power of the z MHz RF generator is dependent on a value of a magnitude of the voltage reflection coefficient at the output of the z MHz RF generator. For example, when Γ1 is measured to be high, such as greater than a pre-determined threshold, the power value PS11 is controlled to be low, such as below a pre-determined limit. As another example, when Γ1 is measured to be low, such as lower than the pre-determined threshold, the power value PS11 is controlled to be high, such as above the pre-determined limit.

FIG. 12 is a diagram of an embodiment of a system 1200 to illustrate effect of the RF cable RFC21 that couples the output of the z MHz RF generator to the input i2 of the IMN 102. The RF cable RFC21 is used instead of the RF cable RFC2 during an active control of power supplied by the z MHz RF generator. The wafer 802 is being processed within the plasma chamber. The system 1200 is the same as the system 1000 of FIG. 10 except that the RF cable RFC2 is replaced with the RF cable RFC21. The RF cable RFC21 is coupled between the output of the z MHz RF generator and the input i2. The sensor measures the variable at the output of the z MHz RF generator. The variable is measured in the system 1200 during a processing routine in which the wafer 802 is being processed. For example, the plasma chamber has the wafer 802 placed on the lower electrode for processing when the variable is measured by the sensor.

FIG. 13 is an embodiment of a table 1300 to illustrate an operation of active control of the system 1200 of FIG. 12 for the RF cable RFC21. As shown in the table 1300, the x kHz RF generator operates during the first cycle at the frequency f11. When the x kHz RF generator operates at the frequency f11, the power supply 112 of the z MHz RF generator is actively controlled to supply power values of Ps16 through Ps20. For example, during the first one-fifth subcycle of the first cycle of operation of the x kHz RF generator, the processor of the host computer system provides the power value Ps16 of operation of the z MHz RF generator to the power controller of the z MHz RF generator. During the second one-fifth subcycle of the first cycle of operation of the x kHz RF generator, the processor of the host computer system provides the power value Ps17 of operation of the z MHz RF generator to the power controller of the z MHz RF generator. Moreover, during the third one-fifth subcycle of the first cycle of operation of the x kHz RF generator, the processor of the host computer system provides the power value Ps18 of operation of the z MHz RF generator to the power controller of the z MHz RF generator. During the fourth one-fifth subcycle of the first cycle of operation of the x kHz RF generator, the processor of the host computer system provides the power value Ps19 of operation of the z MHz RF generator to the power controller of the z MHz RF generator. During the fifth one-fifth subcycle of the first cycle of operation of the x kHz RF generator, the processor of the host computer system provides the power value Ps20 of operation of the z MHz RF generator to the power controller of the z MHz RF generator.

The power controller of the z MHz RF generator provides the power values Ps16 through Ps20 to the power supply 112 to operate the power supply 112 to generate an RF signal having the power values Ps16 through Ps20 during the first cycle of operation of the x kHz RF generator. The control of the power controller of the z MHz RF generator by the processor to change the power values during each cycle of operation of the x kHz RF generator is an active control of the z MHz RF generator. For example, there is a feedback loop from the sensor to the processor of the host computer system to control the power values Ps16 through Ps20. To further illustrate, during the first one-fifth subcycle of the first cycle of operation of the x kHz RF generator, the processor changes power values to achieve the power value Ps16 based on measured values of the variable that are received from the sensor that is coupled to the output of the z MHz RF generator.

The power supply 110 generates an RF signal having the frequency f11 and the power supply 112 generates another RF signal having the frequency f211 and the power values Ps16 through Ps20 during the first cycle of operation of the x kHz RF generator. The RF signal generated by the power supply 112 has the power amount Ps16 during the first one-fifth subcycle of the first cycle of the x kHz RF generator, the power amount Ps17 during the second one-fifth subcycle of the first cycle of the x kHz RF generator, the power amount Ps18 during the third one-fifth subcycle of the first cycle of the x kHz RF generator, the power amount Ps19 during the fourth one-fifth subcycle of the first cycle of the x kHz RF generator, and the power amount Ps20 during the fifth one-fifth subcycle of the first cycle of the x kHz RF generator.

The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f211 and having the power amounts Ps16 through Ps20 is sent from the output of the z MHz RF generator via the RF cable RFC21 to the input i2 of the IMN 102. The IMN 102 matches an impedance of the load coupled to the output o1 with that of the source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode. In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802.

Moreover, the capacitor C1 of the series circuit 108a is controlled to have the capacitance value C111 during the first cycle of operation of the x kHz RF generator in the same manner as described above with reference to FIG. 6. Similarly, the capacitor C2 of the shunt circuit 108b is controlled to have the capacitance value C211 during the first cycle of operation of the x kHz RF generator in the same manner as described above with reference to FIG. 6.

During the first one-fifth subcycle of the first cycle of operation of the x kHz RF generator in which the frequency of operation of the x kHz RF generator is f11, the frequency of operation of the z MHz RF generator is f211, the power supplied by the z MHz RF generator has the power amount Ps16, the value of capacitance of the capacitor C1 is C111, and the value of capacitance of the capacitor C2 is C211, the sensor measures the voltage reflection coefficient to be Γ6 at the output of the z MHz RF generator. Similarly, during the second one-fifth subcycle of the first cycle of operation of the x kHz RF generator in which the frequency of operation of the x kHz RF generator is f11, the frequency of operation of the z MHz RF generator is f211, the power supplied by the z MHz RF generator is has the power amount Ps17, the value of capacitance of the capacitor C1 is C111, and the value of capacitance of the capacitor C2 is C211, the sensor measures the voltage reflection coefficient to be Γ7 at the output of the z MHz RF generator. Furthermore, during the third one-fifth subcycle of the first cycle of operation of the x kHz RF generator in which the frequency of operation of the x kHz RF generator is f11, the frequency of operation of the z MHz RF generator is f211, the power supplied by the z MHz RF generator has the power amount Ps18, the value of capacitance of the capacitor C1 is C111, and the value of capacitance of the capacitor C2 is C211, the sensor measures the voltage reflection coefficient to be Γ8 at the output of the z MHz RF generator. Also, during the fourth one-fifth subcycle of the first cycle of operation of the x kHz RF generator in which the frequency of operation of the x kHz RF generator is f11, the frequency of operation of the z MHz RF generator is f211, the power supplied by the z MHz RF generator has the power amount Ps19, the value of capacitance of the capacitor C1 is C111, and the value of capacitance of the capacitor C2 is C211, the sensor measures the voltage reflection coefficient to be Γ9 at the output of the z MHz RF generator. During the fifth one-fifth subcycle of the first cycle of operation of the x kHz RF generator in which the frequency of operation of the x kHz RF generator is f11, the frequency of operation of the z MHz RF generator is f211, the power supplied by the z MHz RF generator has the power amount Ps20, the value of capacitance of the capacitor C1 is C111, and the value of capacitance of the capacitor C2 is C211, the sensor measures the voltage reflection coefficient to be Γ10 at the output of the z MHz RF generator.

The sensor also measures the power values Ps16 through Ps20 at the output of the z MHz RF generator. The sensor provides the values Γ6 through Γ10 and the power values Ps16 through Ps20 to the processor via the transfer cable that couples the sensor to the processor. The processor stores the value f11, the power values Ps16 through Ps20, the frequency value f211, the value C111, the value C211, and the values Γ6 through Γ10 in the table 1300, which is stored in the memory device. The processor calculates a power-weighted average power reflection coefficient value PWAPRC4 for the first cycle of the x kHz RF generator. For example, the processor calculates the value PWAPRC4 for the first cycle of operation of the x kHz RF generator to be $[\{(Ps16)\times(|\Gamma6|)^2\}+\{(Ps17)\times(|\Gamma7|)^2\}+\{(Ps18)\times(|\Gamma8|)^2\}+\{(Ps19)\times(|\Gamma9|)^2\}+\{(Ps20)\times(|\Gamma100^2|)\}]/5$.

Similarly, during the active control, the processor calculates another power-weighted average power reflection coefficient value PWARPCB for the second cycle of operation of the x kHz RF generator. For example, the processor calculates the value PWARPCB to be $[\{(Ps16B)\times(|\Gamma6B|)^2\}+\{(Ps17B)\times(|\Gamma7B|)^2\}+\{(Ps18B)\times(|\Gamma8B|)^2\}+\{(Ps19B)\times(|\Gamma9B|)^2\}+\{(Ps20B)\times(|\Gamma10B|)^2\}]/5$. It should be noted that during the first one-fifth subcycle of the second cycle of operation of the x kHz RF generator in which the frequency of operation of the x kHz RF generator is f11, the frequency of operation of the z MHz RF generator is controlled to be f211B, the power supplied by the z MHz RF generator is controlled to be Ps16B, the value of capacitance of the capacitor C1 is C111B, and the value of capacitance of the capacitor C2 is C211B, the sensor measures the voltage reflection coefficient to be Γ6B at the output of the z MHz RF generator. Similarly, during the second one-fifth subcycle of the second cycle of operation of the x kHz RF generator in which the frequency of operation of the x kHz RF generator is f11, the frequency of operation of the z MHz RF generator is controlled to be f211B, the power supplied by the z MHz RF generator is controlled to be Ps17B, the value of capacitance of the capacitor C1 is C111B, and the value of capacitance of the capacitor C2 is C211B, the sensor measures the voltage reflection coefficient to be Γ7B at the output of the z MHz RF generator. Furthermore, during the third one-fifth subcycle of the second cycle of operation of the x kHz RF generator in which the frequency of operation of the x kHz RF generator is f11, the frequency of operation of the z MHz RF generator is controlled to be f211B, the power supplied by the z MHz RF generator is controlled to be Ps18B, the value of capacitance of the capacitor C1 is C111B, and the value of capacitance of the capacitor C2 is C211B, the sensor measures the voltage reflection coefficient to be Γ8B at the output of the z MHz RF generator. Also, during the fourth one-fifth subcycle of the second cycle of operation of the x kHz RF generator in which the frequency of operation of the x kHz RF generator is f11, the frequency of operation of the z MHz RF generator is controlled to be f211B, the power supplied by the z MHz RF generator is controlled to be Ps19B, the value of capacitance of the capacitor C1 is C111B, and the value of capacitance of the capacitor C2 is C211B, the sensor measures the voltage reflection coefficient to be Γ9B at the output of the z MHz RF generator. During the fifth one-fifth subcycle of the second cycle of operation of the x kHz RF generator in which the frequency of operation of the x kHz RF generator is f11, the frequency of operation of the z MHz RF generator is controlled to be f211B, the power supplied by the z MHz RF generator is controlled to be Ps20B, the value of capacitance of the capacitor C1 is C111B, and the value of capacitance of the capacitor C2 is C211B, the sensor measures the voltage reflection coefficient to be Γ10B at the output of the z MHz RF generator.

It should be noted that for active control, a frequency of the z MHz RF generator is controlled using the FC of the z MHz RF generator. For example, the processor of the host computer system provides the frequency f211B of operation of the z MHz RF generator to the FC of the z MHz RF generator. The FC of the z MHz RF generator provides the frequency f211B to the power supply 112 to operate the power supply 112 to generate an RF signal having the frequency f211B. Similarly, it should be noted that for active control, an amount of power supplied of the z MHz RF generator is controlled using the power controller of the z MHz RF generator. For example, during the first one-fifth subcycle of a cycle of operation of the x kHz RF generator, the processor of the host computer system provides the amount of power Ps16B for operation of the z MHz RF generator to the power controller of the z MHz RF generator. The power controller of the z MHz RF generator provides the power amount Ps16B to the power supply 112 to operate the power supply 112 to generate an RF signal having the power amount Ps16B. As another example, during the second one-fifth subcycle of the cycle of operation of the x kHz RF generator, the processor of the host computer system provides the amount of power Ps17B for operation of the z MHz RF generator to the power controller of the z MHz RF generator. The power controller of the z MHz RF generator provides the power amount Ps17B to the power supply 112 to operate the power supply 112 to generate an RF signal having the power amount Ps17B. As yet another example, during the third one-fifth subcycle of the cycle of operation of the x kHz RF generator, the processor of the host computer system provides the amount of power Ps18B for operation of the z MHz RF generator to the power controller of the z MHz RF generator. The power controller of the z MHz RF generator provides the power amount Ps18B to the power supply 112 to operate the power supply 112 to generate an RF signal having the power amount Ps18B. As another example, during the fourth one-fifth subcycle of the cycle of operation of the x kHz RF generator, the processor of the host computer system provides the amount of power Ps19B for operation of the z MHz RF generator to the power controller of the z MHz RF generator. The power controller of the z MHz RF generator provides the power amount Ps19B to the power supply 112 to operate the power supply 112 to generate an RF signal having the power amount Ps19B. As yet another example, during the fifth one-fifth subcycle of the cycle of operation of the x kHz RF generator, the processor of the host computer system provides the amount of power Ps20B for operation of the z MHz RF generator to the power controller of the z MHz RF generator. The power controller of the z MHz RF generator provides the power amount Ps20B to the power supply 112 to operate the power supply 112 to generate an RF signal having the power amount Ps20B.

The power supply 110 generates an RF signal having the frequency f11 and the power supply 112 generates another RF signal having the frequency value f211B and the power values Ps16B through Ps20B during the second cycle of operation of the x kHz RF generator. The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency value f211B and having the power values Ps16B through Ps20B is sent from the output of the z MHz RF generator via the RF cable RFC21 to the input i2 of the IMN 102. The RF signal has the power amount Ps16B during the first one-fifth subcycle of the second cycle of the x kHz RF generator, the power amount Ps17B during the second one-fifth subcycle of the second cycle of the x kHz RF generator, the power amount Ps18B during the third one-fifth subcycle of the second cycle of the x kHz RF generator, the power amount Ps19B during the fourth one-fifth subcycle of the second cycle of the x kHz RF generator, and the power amount Ps20B during the fifth one-fifth subcycle of the second cycle of the x kHz RF generator.

The IMN 102 matches an impedance of the load coupled to the output o1 with that of a source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode. In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802.

Over multiple cycles of operation of the x kHz RF generator for the RF cable RFC21, the processor determines a value of the frequency of operation of the z MHz RF generator, a value of power to be supplied by the z MHz RF generator, a capacitance of the capacitor C1, and a capacitance of the capacitor C2 for which there is an increase in efficiency in power delivered by the z MHz RF generator. For example, the processor determines which one of the values PWARPC4 and PWARPCB is low. The processor compares the value PWARPC4 with the value PWARPCB to determine that the value PWARPC4 is lower than the value PWARPCB. There is an increase in efficiency in power delivered by the z MHz RF generator during the first cycle for which the value PWARPC4 is computed. The processor identifies from the table 1300 the value f211 of the frequency of operation of the z MHz RF generator during the first cycle, the values Ps16 through Ps20 of power supplied by the z MHz RF generator, the capacitance C111 of the capacitor C1, and the capacitance C211 of the capacitor C2 for which there is an increase in efficiency in power delivered by the z MHz RF generator when the RF cable RFC21 is used to connect the output of the z MHz RF generator with the input i2 of the IMN 102.

In an embodiment, instead of controlling both the capacitors C1 and C2 to determine capacitances of the capacitors C1 and C2 for which there is an increase in efficiency in power delivered by the z MHz RF generator during the first cycle, either the capacitor C1 or the capacitor C2 is controlled to determine a capacitance of the capacitor for which the efficiency is increased. For example, the value PWARPCB is achieved without controlling the capacitor C1 to have the value C111B. A capacitance of the capacitor C1 is maintained to have the value C111 and the value PWARPCB is determined based on the capacitance C111 instead of the capacitance C111B. There is no change in the capacitance of the capacitor C1 from the first cycle to the second cycle of operation of the x kHz RF generator. As another example, the value PWARPCB is achieved without controlling the capacitor C2 to have the value C211B. A capacitance of the capacitor C2 is controlled to have the value C211 and the value PWARPCB is determined based on the capacitance C211. There is no change in the capacitance of the capacitor C2 from the first cycle to the second cycle of operation of the x kHz RF generator. As yet another example, the value PWARPC4 is achieved without controlling the capacitor C1 to have the value C111. There is no change in the capacitance of the capacitor C1 leading to the first cycle of operation of the x kHz RF generator. As another example, the value PWARPC4 is achieved without controlling the capacitor C2 to have the value C211. There is no change in the capacitance of the capacitor C2 leading to the first cycle of operation of the x kHz RF generator.

It should be noted that a power value of supplied power of the z MHz RF generator is dependent on a value of a magnitude of the voltage reflection coefficient at the output of the z MHz RF generator. For example, when Γ6 is measured to be high, such as greater than the pre-determined threshold, the power value PS16 is controlled to be low, such as below the pre-determined limit. As another example, when Γ6 is measured to be low, such as lower than the pre-determined threshold, the power value PS16 is controlled to be high, such as above the pre-determined limit.

FIG. 14 is an embodiment of the table 1400 to illustrate the processing routine of the system 1200 of FIG. 12 once the power values Ps16 through Ps20, the frequency value f211, the capacitance C111, and the capacitance C211 are identified for active control of the z MHz RF generator. The RF cable RFC21 is used in the system 1200 instead of the RF cable RFC2. As shown in the table 1400, the x kHz RF generator operates repetitively with a cycle that has the frequency f11. Each cycle of operation of the x kHz RF generator has the frequency f11. During the processing routine, the processor of the host computer system provides the frequency f11 of operation of the x kHz RF generator to the FC of the x kHz RF generator. The FC provides the frequency f11 to the power supply 110 and the power supply 110 generates an RF signal having the frequency f11 during the cycle of operation of the x kHz RF generator.

When the x kHz RF generator operates at the frequency f11 during the first one-fifth subcycle of a cycle of operation of the x kHz RF generator, the power supply 112 of the z MHz RF generator is actively controlled by the processor of the host control system to generate an RF signal having the power value Ps16. Similarly, when the x kHz RF generator operates at the frequency f11 during the second one-fifth subcycle of the cycle of operation of the x kHz RF generator, the power supply 112 of the z MHz RF generator is controlled to supply the power value of Ps17. Moreover, when the x kHz RF generator operates at the frequency f11 during the third one-fifth subcycle of the cycle of operation of the x kHz RF generator, the power supply 112 of the z MHz RF generator is controlled to supply the power value of Ps18. When the x kHz RF generator operates at the frequency f11 during the fourth one-fifth subcycle of the cycle of operation of the x kHz RF generator, the power supply 112 of the z MHz RF generator is controlled to supply the power value of Ps19. Also, when the x kHz RF generator operates at the frequency f11 during the fifth one-fifth subcycle of the cycle of operation of the x kHz RF generator, the power supply 112 of the z MHz RF generator is controlled to supply the power value of Ps20.

The processor identifies from the table 1400 the value f211 of the frequency of operation of the z MHz RF generator, the power values Ps16 through Ps20 to be supplied by the z MHz RF generator, the capacitance C111 of the capacitor C1, and the capacitance C211 of the capacitor C2 for which there is an increase in efficiency in power delivered by the z MHz RF generator. The z MHz RF generator is controlled by the processor to be operated at the frequency of f211 and at the power values Ps16 through Ps20 for each cycle during multiple cycles of the x kHz RF generator. For example, the processor of the host computer system provides the frequency f211 of operation of the z MHz RF generator to the FC of the z MHz RF generator. The FC of the z MHz RF generator provides the frequency f211 to the power supply 112 to operate the power supply 112 to generate an RF signal having the frequency f211 during the cycles of operation of the x kHz RF generator. As another example, the processor of the host computer system provides the power values Ps16 through Ps20 of operation of the z MHz RF generator to the power controller of the z MHz RF generator. The power controller of the z MHz RF generator provides the power values Ps16 through Ps20 to the power supply 112 to operate the power supply 112 to generate an RF signal having the power values Ps16 through Ps20 for each cycle during the cycles of operation of the x kHz RF generator.

Moreover, the capacitor C1 of the series circuit 108a is controlled by the processor to have the capacitance value C111 during the cycles of operation of the x kHz RF generator in the same manner described above with reference to FIG. 13. Similarly, the capacitor C2 of the shunt circuit 108b is controlled by the processor to have the capacitance value C211 during the cycles of operation of the x kHz RF generator in the same manner described above with reference to FIG. 13.

The power supply 110 generates an RF signal having the frequency f11 and the power supply 112 generates another RF signal having the frequency f211 and the power values Ps16 through Ps20 for each cycle during the cycles of operation of the processing routine of the x kHz RF generator. The RF signal generated by the power supply 110 and having the frequency f11 is sent from the output of the x kHz RF generator via the RF cable RFC1 to the input i1 of the IMN 102. Similarly, the RF signal generated by the power supply 110, having the frequency f211 and having the power values Ps16 through Ps20 is sent from the output of the z MHz RF generator via the RF cable RFC21 to the input i2 of the IMN 102. For example, the RF signal has the power amount Ps16 during the first one-fifth subcycle of each cycle of the x kHz RF generator, the power amount Ps17 during the second one-fifth subcycle of each cycle of the x kHz RF generator, the power amount Ps18 during the third one-fifth subcycle of each cycle of the x kHz RF generator, the power amount Ps19 during the fourth one-fifth subcycle of each cycle of the x kHz RF generator, and the power amount Ps20 during the fifth one-fifth subcycle of each cycle of the x kHz RF generator.

The IMN 102 matches an impedance of the load coupled to the output o1 with that of the source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode.

In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802. When the frequency f211, the power values Ps16 through Ps20, the capacitance C111, and the capacitance C211 are maintained over multiple cycles of operation of the x kHz RF generator, there is an increase in efficiency in power delivered by the z MHz RF generator during the processing routine In an embodiment, during the processing routine having the multiple cycles of operation of the x kHz RF generator, instead of controlling both the capacitors C1 and C2 to achieve the capacitance C111 of the capacitance C1 and the capacitance C211 of the capacitor C2 for which there is an increase in efficiency in power delivered by the z MHz RF generator, either the capacitor C1 or the capacitor C2 is controlled to increase the efficiency. For example, the processor does not control the capacitor C1 via the motor M1 so that the capacitor C1 has the capacitance C111. Rather, the processor controls the capacitor C2 via the motor M2 so that the capacitor C2 has the capacitance C211. As another example, the processor does not control the capacitor C2 via the motor M2 so that the capacitor C2 has the capacitance C211. Rather, the processor controls the capacitor C1 via the motor M1 so that the capacitor C1 has the capacitance C111.

In one embodiment, during the processing routine for the active control with the RF cable RFC21, each cycle of operation of the x kHz RF generator is split into a number of subcycles other than five.

FIG. 15 is an embodiment of the table 1500 to illustrate the processing routine of the system 1000 of FIG. 10 once the power values Ps11 through Ps15, the frequency value f21, the capacitance C11, and the capacitance C21 are identified. The RF cable RFC2 is used in the system 1000. As shown in the table 1500, the x kHz RF generator operates repetitively with a cycle that has the frequency f11. Each cycle of operation of the x kHz RF generator has the frequency f11. During the processing routine, the processor of the host computer system provides the frequency f11 of operation of the x kHz RF generator to the FC of the x kHz RF generator. The FC provides the frequency f11 to the power supply 110 and the power supply 110 generates an RF signal having the frequency f11 during the cycle of operation of the x kHz RF generator.

When the x kHz RF generator operates at the frequency f11, the processor identifies from the table 1500 the value f21 of the frequency of operation of the z MHz RF generator, the power values Ps11 through Ps15 to be supplied by the z MHz RF generator, the capacitance C11 of the capacitor C1, and the capacitance C21 of the capacitor C2 for which there is an increase in efficiency in power delivered by the z MHz RF generator. The z MHz RF generator is controlled by the processor to be operated at the frequency of f21 and at the power values Ps11 through Ps15 during each cycle for multiple cycles of the x kHz RF generator. For example, the processor of the host computer system provides the frequency f21 of operation of the z MHz RF generator to the FC of the z MHz RF generator. The FC of the z MHz RF generator provides the frequency f21 to the power supply 112 to operate the power supply 112 to generate an RF signal having the frequency f21 during the cycles of operation of the x kHz RF generator. As another example, the processor of the host computer system provides the power values Ps11 through Ps15 of operation of the z MHz RF generator to the power controller of the z MHz RF generator. The power controller of the z MHz RF generator provides the power values Ps11 through Ps15 to the power supply 112 to generate an RF signal having the power values Ps11 through Ps15 for each cycle during the cycles of operation of the x kHz RF generator. To illustrate, the power controller of the z MHz RF generator provides to the power supply 112, the power amount Ps11 during the first one-fifth subcycle of each cycle of the x kHz RF generator, the power amount Ps12 during the second one-fifth subcycle of each cycle of the x kHz RF generator, the power amount Ps13 during the third one-fifth subcycle of each cycle of the x kHz RF generator, the power amount Ps14 during the fourth one-fifth subcycle of each cycle of the x kHz RF generator, and the power amount Ps15 during the fifth one-fifth subcycle of each cycle of the x kHz RF generator.

Moreover, the capacitor C1 of the series circuit 108a is controlled by the processor to have the capacitance value C11 during the cycles of operation of the x kHz RF generator in the same manner described above with reference to FIG. 11. Similarly, the capacitor C2 of the shunt circuit 108b is controlled by the processor to have the capacitance value C21 during the cycles of operation of the x kHz RF generator in the same manner described above with reference to FIG. 11.

The power supply 110 generates an RF signal having the frequency f11 and the power supply 112 generates another RF signal having the frequency f21 and the power values Ps11 through Ps15 for each cycle during the cycles of operation of the processing routine of the x kHz RF generator. For example, the RF signal has the power amount Ps11 during the first one-fifth subcycle of each cycle of the x kHz RF generator, the power amount Ps12 during the second one-fifth subcycle of each cycle of the x kHz RF generator, the power amount Ps13 during the third one-fifth subcycle of each cycle of the x kHz RF generator, the power amount Ps14 during the fourth one-fifth subcycle of each cycle of the x kHz RF generator, and the power amount Ps15 during the fifth one-fifth subcycle of each cycle of the x kHz RF generator.

The RF signal generated by the power supply 110 and having the frequency f11 is sent from the output of the x kHz RF generator via the RF cable RFC1 to the input i1 of the IMN 102. Similarly, the RF signal generated by the power supply 112, having the frequency f21 and having the power values Ps11 through Ps15 is sent from the output of the z MHz RF generator via the RF cable RFC2 to the input i2 of the IMN 102. The IMN 102 matches an impedance of the load coupled to the output o1 with that of the source coupled to the inputs i1 and i2 and combines at the output o1 the RF signals received from the x kHz RF generator and the z MHz RF generator to generate a modified RF signal. The modified RF signal is sent from the output of via the RF transmission line RFT to the lower electrode.

In addition to supplying the modified RF signal to the lower electrode, the one or more process gases are supplied via the upper electrode to the gap between the lower electrode and the upper electrode of the plasma chamber. Upon reception of the modified RF signal and the one or more process gases, plasma is generated or is maintained within the gap to process the wafer 802. When the frequency f21, the power values Ps11 through Ps15, the capacitance C11, and the capacitance C21 are maintained over multiple cycles of operation of the x kHz RF generator, there is an increase in efficiency in power delivered by the z MHz RF generator during the processing routine In an embodiment, during the processing routine having the multiple cycles of operation of the x kHz RF generator for which the RF cable RFC2 is used, instead of controlling both the capacitors C1 and C2 to achieve the capacitance C11 and the capacitance C21 for which there is an increase in efficiency in power delivered by the z MHz RF generator, either the capacitor C1 or the capacitor C2 is controlled to increase the efficiency in a manner similar to that described above with reference to FIG. 11.

In one embodiment, during the processing routine, each cycle of operation of the x kHz RF generator is split into a number of subcycles other than five in a manner similar to that described above with reference to FIG. 11.

Figure 16:
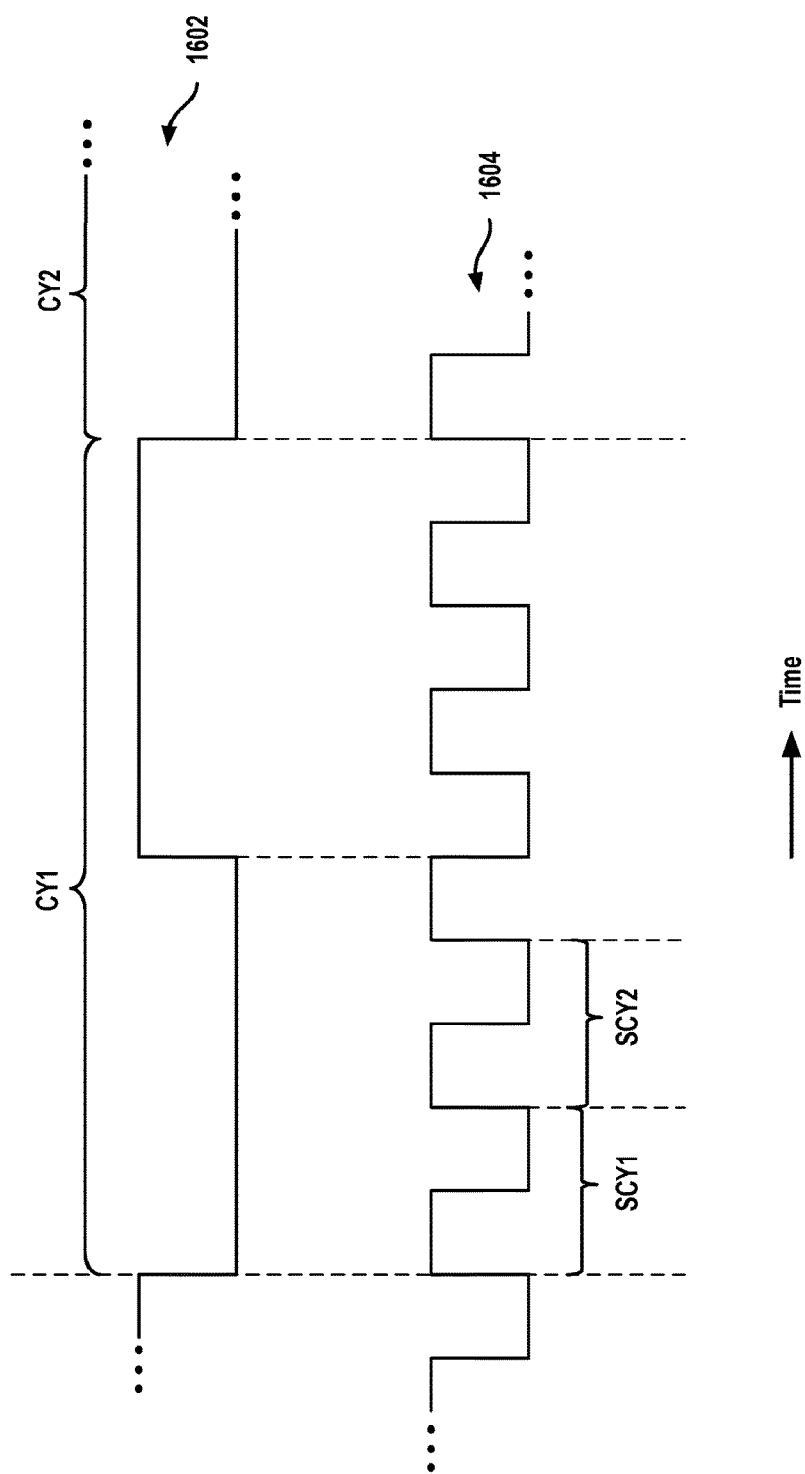
FIG. 16 illustrates multiple clock signals to illustrate a cycle and a subcycle of the cycle.

FIG. 16 illustrates multiple clock signals 1602 and 1604 to illustrate a cycle and a subcycle. The clock signal 1602 repeats with multiple cycles, such as a cycle CY1 and a cycle CY2. Each cycle CY1 and CY2 covers the same amount of time period. The cycle CY2 is consecutive to the cycle CY1. For example, there is no other cycle between the cycles CY2 and CY1. The clock signal 1602 having the cycles CY1 and CY2 is generated by a clock source, such as, the processor, or a clock oscillator, or a clock oscillator coupled with a phase locked loop, of the host computer system and provided from the clock source of the host computer system to one or more controllers, such as the FC and/or the power controller, of the z MHz RF generator to generate an RF signal in synchronization with the clock signal 1602. In addition, the clock signal 1602 is provided from the clock source of the host computer system to one or more controllers, such as the FC and/or a power controller, of the x kHz RF generator to generate an RF signal in synchronization with the clock signal 1602.

Moreover, in one embodiment, the clock signal 1604 having multiple subcycles, such as a subcycle SCY1 and SCY2, is generated by the clock source of the host computer system and is provided to the one or more controllers of the x kHz RF generator to generate an RF signal in synchronization with the clock signal 1604. In addition, the clock signal 1604 is provided by the clock source to the one or more controllers of the z MHz RF generator to generate an RF signal in synchronization with the clock signal 1604. The subcycle SCY2 is consecutive to the cycle SCY1. For example, there is no other subcycle between the subcycles SCY2 and SCY1. Each subcycle SCY1 and SCY2 covers the same amount of time period.

In one embodiment, the x kHz RF generator or the z MHz RF generator acts as a master and the other one acts as a slave. For example, the clock signal 1602 is generated by the clock source of the host computer system and provided from the clock source of the host computer system to the one or more controllers of the z MHz RF generator. The one or more controllers of the z MHz RF generator generate the clock signal 1604 from the clock signal 1602 and send the clock signal 1604 to the one or more controllers of the x kHz RF generator for generating an RF signal in synchronization with the clock signal 1604. As another example, the clock signal 1602 is generated by the clock source of the host computer system and provided from the clock source of the host computer system to the one or more controllers of the x kHz RF generator. The one or more controllers of the x kHz RF generator generate the clock signal 1604 from the clock signal 1602 and send the clock signal 1604 to the one or more controllers of the z MHz RF generator for generating an RF signal in synchronization with the clock signal 1604.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational limits for carrying out a particular process on or for a semiconductor wafer or to a system. The operational limits are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change limits of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of limits and/or settings, which are then communicated to the system from the remote computer. In some examples, the controller receives instructions in the form of data, which specify limits for each of the processing steps to be performed during one or more operations. It should be understood that the limits are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for passive control of a radio frequency (RF) generator, comprising:

supplying, by a low frequency RF generator, a low frequency RF signal to an impedance matching network coupled to a plasma chamber, wherein the impedance matching network includes a circuit;

supplying, by a high RF generator, a high RF signal to the impedance matching network;

accessing a plurality of measurement values of a variable measured at an output of the high RF generator to generate a parameter, wherein the variable is measured during a plurality of cycles of operation of the low RF generator, wherein the plurality of measurement values are associated with a plurality of values of power supplied by the high RF generator; and determining, based on the parameter, a value of a frequency of the high RF generator and a value of a factor associated with the circuit for which there is an increase in efficiency in power delivered by the high RF generator.

2. The method of claim 1, wherein the circuit is a series circuit, wherein the low RF signal is a kilohertz signal and the high RF signal is a megahertz signal, wherein the variable is a voltage reflection coefficient and the parameter is a power reflection coefficient, and wherein the factor is a capacitance of a capacitor of the circuit.

3. The method of claim 1, wherein said supplying the low RF signal, supplying the high RF signal, accessing the plurality of measurement values, and determining the value of the frequency of the high RF generator and the value of the factor are performed during a training routine in which a substrate is not being processed, the method further comprising controlling the high RF generator to achieve the value of the frequency and the circuit to achieve the factor during a processing operation in which the substrate is processed.

4. The method of claim 1, wherein said determining the value of the frequency and the value of the factor is based on a plurality of average values, wherein each of the plurality of average values is calculated from a corresponding subset of the plurality of measurement values of the variable received during a corresponding one of the plurality of cycles and a subset of the plurality of values of the power supplied by the high RF generator during the corresponding one of the plurality of cycles.

5. The method of claim 1, further comprising calculating, for one of the plurality of cycles, an average value of a product of a square of a magnitude of a first one of the plurality of measurement values of the variable and a first one of the plurality of values of the power supplied by the high RF generator and a product of a square of a magnitude of a second one of the plurality of measurement values of the variable and a second one of the plurality of values of the power supplied by the high RF generator, wherein during the one of the plurality of cycles, the high RF generator operates at the value of the frequency and the circuit operates at the factor.

6. The method of claim 5, further comprising calculating, for another one of the plurality of cycles, another average value of a product of a square of a magnitude of a third one of the plurality of measurement values of the variable and a third one of the plurality of values of the power supplied by the high RF generator and a product of a square of a magnitude of a fourth one of the plurality of measurement values of the variable and a fourth one of the plurality of values of the power supplied by the high RF generator, wherein during the other one of the plurality of cycles, the high RF generator operates at another value of the frequency and the circuit operates at another factor.

7. The method of claim 6, further comprising determining that the average value for the one of the plurality of cycles is less than the other average value for the other one of the plurality of cycles, wherein said determining the value of the frequency and the value of the factor comprises identifying the value of the frequency and the value of the factor for the one of the plurality of cycles for which the average value is less than the other average value for the other one of the plurality of cycles.

8. The method of claim 1, wherein the low RF generator is connected to the impedance matching network via an RF cable and the high RF generator is connected to the impedance matching network via another RF cable, the method further comprising:

accessing another plurality of measurement values of the variable measured at the output of the high RF generator, wherein the measurement values of the other plurality are measured during another plurality of cycles of operation of the low RF generator, wherein the measurement values of the other plurality are measured after the other RF cable that is coupled between the impedance matching network and the high RF generator is changed, wherein the measurement values of the other plurality are associated with another plurality of values of the power supplied by the high RF generator; and determining another value of the frequency of the high RF generator and another value of the factor associated with the circuit for which there is an increase in efficiency in the power delivered by the high RF generator, wherein said determining the other value of the frequency and the other value of the factor are performed after the other RF cable that is coupled between the impedance matching network and the high RF generator is changed.

9. A method for active control of a radio frequency (RF) generator, comprising:

supplying, by a low RF generator, a low RF signal to an impedance matching network coupled to a plasma chamber, wherein the impedance matching network includes a circuit;

supplying, by a high RF generator, a high RF signal to the impedance matching network;

accessing a plurality of measurement values of a variable measured at an output of the high RF generator to generate a parameter, wherein the variable is measured during a plurality of cycles of operation of the low RF generator, wherein the plurality of measurement values are associated with a plurality of values of power supplied by the high RF generator; and determining, based on the parameter, a value of a frequency of the high RF generator, a plurality of amounts of the power to be supplied by the high RF generator, and a value of a factor associated with the circuit for which there is an increase in efficiency in power delivered by the high RF generator.

10. The method of claim 9, wherein the circuit is a series circuit, wherein the low RF signal is a kilohertz signal and the high RF signal is a megahertz signal, wherein the variable is a voltage reflection coefficient and the parameter is a power reflection coefficient, and wherein the factor is a capacitance of a capacitor of the circuit.

11. The method of claim 9, wherein said supplying of the low RF signal, supplying of the high RF signal, accessing the plurality of measurement values, and determining the value of the frequency of the high RF generator, the plurality of amounts of the power to be supplied by the high RF generator, and the value of the factor are performed during processing of a substrate.

12. The method of claim 9, wherein said determining the value of the frequency of the high RF generator, the plurality of amounts of the power to be supplied by the high RF generator, and the value of the factor associated with the circuit is based on a plurality of average values, wherein each of the plurality of average values is calculated from a corresponding subset of the plurality of measurement values of the variable received during a corresponding one of the plurality of cycles and a subset of the plurality of values of the power supplied by the high RF generator during the corresponding one of the plurality of cycles.

13. The method of claim 9, further comprising calculating, for one of the plurality of cycles, an average value of a product of a square of a magnitude of a first one of the plurality of measurement values of the variable and a first one of the plurality of values of the power supplied by the high RF generator and a product of a square of a magnitude of a second one of the plurality of measurement values of the variable and a second one of the plurality of values of the power supplied by the high RF generator, wherein during the one of the plurality of cycles, the high RF generator operates at the value of the frequency and the circuit operates at the factor.

14. The method of claim 13, further comprising calculating, for another one of the plurality of cycles, another average value of a product of a square of a magnitude of a third one of the plurality of measurement values of the variable and a third one of the plurality of values of the power supplied by the high RF generator and a product of a square of a magnitude of a fourth one of the plurality of measurement values of the variable and a fourth one of the plurality of values of the power supplied by the high RF generator, wherein during the other one of the cycles, the high RF generator operates at another value of the frequency and the circuit operates at another factor.

15. The method of claim 14, further comprising determining that the average value for the one of the plurality of cycles is less than the other average value for the other one of the plurality of cycles, wherein said determining the value of the frequency of the high RF generator, the plurality of amounts of the power to be supplied by the high RF generator, and the value of the factor associated with the circuit comprises identifying the value of the frequency, the plurality of amounts of the power to be supplied by the high RF generator, and the value of the factor for the one of the plurality of cycles for which the average value is less than the other average value for the other one of the plurality of cycles.

16. The method of claim 9, wherein the low RF generator is connected to the impedance matching network via an RF cable, wherein the high RF generator is connected to the impedance matching network via another RF cable, the method further comprising:

accessing another plurality of measurement values of the variable measured at the output of the high RF generator, wherein the measurement values of the other plurality are measured during another plurality of cycles of operation of the low RF generator, wherein the measurement values of the other plurality are measured after the other RF cable that is coupled between the impedance matching network and the high RF generator is changed, wherein the measurement values of the other plurality are associated with another plurality of values of the power supplied by the high RF generator; and determining, another value of the frequency of the high RF generator, another plurality of amounts of the power to be supplied by the high RF generator, and another value of the factor associated with the circuit for which there is an increase in efficiency in the power delivered by the high RF generator, wherein said determining the other value of the frequency, the other plurality of amounts of the power to be supplied by the high RF generator, and the other value of the factor is performed after the other RF cable that is coupled between the impedance matching network and the high RF generator is changed.

17. A controller system for passive control of a radio frequency (RF) generator, comprising:

a processor configured to:

access a plurality of measurement values of a variable measured at an output of a high RF generator to generate a parameter, wherein the variable is measured during a plurality of cycles of operation of a low RF generator, wherein the plurality of measurement values are associated with a plurality of values of power supplied by the high RF generator; and determine, based on the parameter, a value of a frequency of the high RF generator and a value of a factor associated with a circuit of an impedance matching network for which there is an increase in efficiency in power delivered by the high RF generator; and a memory device coupled to the processor, wherein the memory device is configured to store the value of the frequency of the high RF generator and the value of the factor.

18. The controller system of claim 17, wherein the circuit is a series circuit, wherein the low RF signal is a kilohertz signal and the high RF signal is a megahertz signal, wherein the variable is a voltage reflection coefficient and the parameter is a power reflection coefficient, and wherein the factor is a capacitance of a capacitor of the circuit.

19. The controller system of claim 17, wherein the processor is configured to access the plurality of measurement values and determine the value of the frequency of the high RF generator and the value of the factor during a training routine in which a substrate is not being processed, wherein the processor is further configured to control the high RF generator to achieve the value of the frequency and to control the circuit to achieve the factor during a processing operation in which the substrate is processed.

20. The controller system of claim 17, wherein the processor is configured to determine the value of the frequency and the value of the factor based on a plurality of average values, wherein the processor is configured to calculate each of the plurality of average values from a corresponding subset of the plurality of measurement values of the variable received during a corresponding one of the plurality of cycles and a subset of the plurality of values of the power supplied by the high RF generator during the corresponding one of the plurality of cycles.

21. The controller system of claim 17, wherein the processor is configured to calculate, for one of the plurality of cycles, an average value of a product of a square of a magnitude of a first one of the plurality of measurement values of the variable and a first one of the plurality of values of the power supplied by the high RF generator and a product of a square of a magnitude of a second one of the plurality of measurement values of the variable and a second one of the plurality of values of the power supplied by the high RF generator, wherein during the one of the plurality of cycles, the high RF generator operates at the value of the frequency and the circuit operates at the factor.

22. The controller system of claim 21, wherein the processor is configured to calculate, for another one of the plurality of cycles, another average value of a product of a square of a magnitude of a third one of the plurality of measurement values of the variable and a third one of the plurality of values of the power supplied by the high RF generator and a product of a square of a magnitude of a fourth one of the plurality of measurement values of the variable and a fourth one of the plurality of values of the power supplied by the high RF generator, wherein during the other one of the plurality of cycles, the high RF generator operates at another value of the frequency and the circuit operates at another factor.

23. The controller system of claim 22, wherein the processor is configured to determine that the average value for the one of the plurality of cycles is less than the other average value for the other one of the plurality of cycles, wherein to determine the value of the frequency and the value of the factor, the processor is configured to identify the value of the frequency and the value of the factor for the one of the plurality of cycles for which the average value is less than the other average value for the other one of the plurality of cycles.

24. The controller system of claim 17, wherein the low RF generator is connected to the impedance matching network via an RF cable, wherein the high RF generator is connected to the impedance matching network via another RF cable, wherein the processor is further configured to:
access another plurality of measurement values of the variable measured at the output of the high RF generator, wherein the measurement values of the other plurality are measured during another plurality of cycles of operation of the low RF generator, wherein the measurement values of the other plurality are measured after the other RF cable that is coupled between the impedance matching network and the high RF generator is changed, wherein the measurement values of the other plurality are associated with another plurality of values of the power supplied by the high RF generator; and
determine another value of the frequency of the high RF generator and another value of the factor associated with the circuit for which there is an increase in efficiency in the power delivered by the high RF generator, wherein the determination of the other value of the frequency and the other value of the factor is performed after the other RF cable that is coupled between the impedance matching network and the high RF generator is changed.

25. A controller system for active control of a radio frequency (RF) generator, comprising:
a processor configured to:
access a plurality of measurement values of a variable measured at an output of a high RF generator to generate a parameter, wherein the variable is measured during a plurality of cycles of operation of a low RF generator, wherein the plurality of measurement values are associated with a plurality of values of power supplied by the high RF generator; and
determine, based on the parameter, a value of a frequency of the high RF generator, a plurality of amounts of the power to be supplied by the high RF generator, and a value of a factor associated with a circuit of an impedance matching network for which there is an increase in efficiency in power delivered by the high RF generator.

26. The controller system of claim 25, wherein the circuit is a series circuit, wherein the low RF signal is a kilohertz signal and the high RF signal is a megahertz signal, wherein the variable is a voltage reflection coefficient, the parameter is a power reflection coefficient, and wherein the factor is a capacitance of a capacitor of the circuit.

27. The controller system of claim 25, wherein the processor is configured to access the plurality of measurement values and determine the value of the frequency of the high RF generator, the plurality of amounts of the power to be supplied by the high RF generator, and the value of the factor during processing of a substrate.

28. The controller system of claim 25, wherein the processor is configured to determine the value of the frequency of the high RF generator, the plurality of amounts of the power to be supplied by the high RF generator, and the value of the factor associated with the circuit based on a plurality of average values, wherein the processor is configured to calculate each of the average values from a corresponding subset of the measurement values of the variable received during a corresponding one of the plurality of cycles and a subset of the values of the power supplied by the high RF generator during the corresponding one of the plurality of cycles.

29. The controller system of claim 25, wherein the processor is configured to calculate, for one of the plurality of cycles, an average value of a product of a square of a magnitude of a first one of the plurality of measurement values of the variable and a first one of the plurality of values of the power supplied by the high RF generator and a product of a square of a magnitude of a second one of the plurality of measurement values of the variable and a second one of the plurality of values of the power supplied by the high RF generator, wherein during the one of the plurality of cycles, the high RF generator operates at the value of the frequency and the circuit operates at the factor.

30. The controller system of claim 29, wherein the processor is configured to calculate, for another one of the plurality of cycles, another average value of a product of a square of a magnitude of a third one of the plurality of measurement values of the variable and a third one of the plurality of values of the power supplied by the high RF generator and a product of a square of a magnitude of a fourth one of the plurality of measurement values of the variable and a fourth one of the plurality of values of the power supplied by the high RF generator, wherein during the other one of the plurality of cycles, the high RF generator operates at another value of the frequency and the circuit operates at another factor.

31. The controller system of claim 30, wherein the processor is configured to determine that the average value for the one of the plurality of cycles is less than the other average value for the other one of the plurality of cycles, wherein to determine the value of the frequency of the high RF generator, the plurality of amounts of the power to be supplied by the high RF generator, and the value of the factor associated with the circuit, the processor is configured to identify the value of the frequency, the plurality of amounts of power, and the value of the factor for the one of the plurality of cycles for which the average value is less than the other average value for the other one of the plurality of cycles.

32. The controller system of claim 25, wherein the low RF generator is connected to the impedance matching network via an RF cable, wherein the high RF generator is connected to the impedance matching network via another RF cable, wherein the processor is further configured to:
  access another plurality of measurement values of the variable measured at the output of the high RF generator, wherein the measurement values of the other plurality are measured during another plurality of cycles of operation of the low RF generator, wherein the measurement values of the other plurality are measured after the other RF cable that is coupled between the impedance matching network and the high RF generator is changed, wherein the measurement values of the other plurality are associated with another plurality of values of the power supplied by the high RF generator; and
  determine, another value of the frequency of the high RF generator, another plurality of amounts of the power to be supplied by the high RF generator, and another value of the factor associated with the circuit for which there is an increase in efficiency in the power delivered by the high RF generator, wherein the processor is configured to determine the other value of the frequency, the other plurality of amounts of the power to be supplied by the high RF generator, and the other value of the factor after the other RF cable that is coupled between the impedance matching network and the high RF generator is changed.

33. A system for passive control of a radio frequency (RF) generator, comprising:
  an impedance matching network, wherein the impedance matching network includes a circuit;
  a plasma chamber coupled to the impedance matching network;
  a low RF generator coupled to the impedance matching network and configured to supply a low RF signal to the impedance matching network;
  a high RF generator coupled to the impedance matching network and configured to supply a high RF signal to the impedance matching network;
  a controller system coupled to the high RF generator, wherein the controller system includes a processor configured to:
    access a plurality of measurement values of a variable measured at an output of the high RF generator to generate a parameter, wherein the variable is measured during a plurality of cycles of operation of the low RF generator, wherein the plurality of measurement values are associated with a plurality of values of power supplied by the high RF generator; and
    determine, based on the parameter, a value of a frequency of the high RF generator and a value of a factor associated with the circuit for which there is an increase in efficiency in power delivered by the high RF generator.

34. The system of claim 33, wherein the circuit is a series circuit, wherein the low RF signal is a kilohertz signal and the high RF signal is a megahertz signal, wherein the variable is a voltage reflection coefficient and the parameter is a power reflection coefficient, and wherein the factor is a capacitance of a capacitor of the circuit.

35. The system of claim 33, wherein the processor is configured to access the plurality of measurement values and determine the value of the frequency of the high RF generator and the value of the factor during a training routine in which a substrate is not being processed, wherein the processor is further configured to control the high RF generator to achieve the value of the frequency and to control the circuit to achieve the factor during a processing operation in which the substrate is processed.

36. The system of claim 33, wherein the processor is configured to determine the value of the frequency and the value of the factor based on a plurality of average values, wherein the processor is configured to calculate each of the plurality of average values from a corresponding subset of the plurality of measurement values of the variable received during a corresponding one of the plurality of cycles and a subset of the plurality of values of the power supplied by the high RF generator during the corresponding one of the plurality of cycles.

37. A system for active control of a radio frequency (RF) generator, comprising:
  an impedance matching network, wherein the impedance matching network includes a circuit;
  a plasma chamber coupled to the impedance matching network;
  a low RF generator coupled to the impedance matching network and configured to supply a low RF signal to the impedance matching network;
  a high RF generator coupled to the impedance matching network and configured to supply a high RF signal to the impedance matching network;
  a controller system coupled to the high RF generator, wherein the controller system includes a processor configured to:
    access a plurality of measurement values of a variable measured at an output of the high RF generator to generate a parameter, wherein the variable is measured during a plurality of cycles of operation of the low RF generator, wherein the measurement values are associated with a plurality of values of power supplied by the high RF generator; and
    determine, based on the parameter, a value of a frequency of the high RF generator, a plurality of amounts of the power to be supplied by the high RF generator, and a value of a factor associated with the circuit for which there is an increase in efficiency in power delivered by the high RF generator.

38. The system of claim 37, wherein the circuit is a series circuit, wherein the low RF signal is a kilohertz signal and the high RF signal is a megahertz signal, wherein the variable is a voltage reflection coefficient and the parameter is a power reflection coefficient, and wherein the factor is a capacitance of a capacitor of the circuit.

39. The system of claim 37, wherein the processor is configured to access the plurality of measurement values and determine the value of the frequency of the high RF generator, the plurality of amounts of the power to be supplied by the high RF generator, and the value of the factor during processing of a substrate.

40. The system of claim 37, wherein the processor is configured to determine the value of the frequency of the high RF generator, the plurality of amounts of the power to be supplied by the high RF generator, and the value of the factor associated with the circuit based on a plurality of average values, wherein the processor is configured to calculate each of the plurality of average values from a corresponding subset of the plurality of measurement values of the variable received during a corresponding one of the plurality of cycles and a subset of the plurality of values of the power supplied by the high RF generator during the corresponding one of the plurality of cycles.

* * * * *